(12) United States Patent
Kumar et al.

(10) Patent No.: US 11,243,470 B2
(45) Date of Patent: Feb. 8, 2022

(54) METHOD AND APPARATUS FOR DERIVING CORRECTIONS, METHOD AND APPARATUS FOR DETERMINING A PROPERTY OF A STRUCTURE, DEVICE MANUFACTURING METHOD

(71) Applicant: ASML NETHERLANDS B.V., Veldhoven (NL)

(72) Inventors: Nitish Kumar, Eindhoven (NL); Adrianus Johannes Hendrikus Schellekens, Liempde (NL); Sietse Thijmen Van Der Post, Utrecht (NL); Ferry Zijp, Nuenen (NL); Willem Maria Julia Marcel Coene, Geldrop (NL); Peter Danny Van Voorst, Nijmegen (NL); Duygu Akbulut, Eindhoven (NL); Sarathi Roy, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/331,547

(22) PCT Filed: Aug. 21, 2017

(86) PCT No.: PCT/EP2017/070990
§ 371 (c)(1),
(2) Date: Mar. 8, 2019

(87) PCT Pub. No.: WO2018/046284
PCT Pub. Date: Mar. 15, 2018

(65) Prior Publication Data
US 2019/0212660 A1 Jul. 11, 2019

Related U.S. Application Data

(60) Provisional application No. 62/440,055, filed on Dec. 29, 2016, provisional application No. 62/393,533, filed on Sep. 12, 2016.

(51) Int. Cl.
*G03F 7/20* (2006.01)

(52) U.S. Cl.
CPC ........ *G03F 7/70191* (2013.01); *G03F 7/7085* (2013.01); *G03F 7/70341* (2013.01);
(Continued)

(58) Field of Classification Search
CPC ............ G03F 7/70191; G03F 7/70341; G03F 7/70516; G03F 7/7085; G03F 7/70916; G03F 7/70941
See application file for complete search history.

(56) References Cited

U.S. PATENT DOCUMENTS

2005/0052651 A1 3/2005 Kim
2006/0033921 A1 2/2006 Den Boef et al.
(Continued)

FOREIGN PATENT DOCUMENTS

EP 1411393 4/2004
EP 1868035 12/2007
(Continued)

OTHER PUBLICATIONS

Japanese Office Action issued in corresponding Japanese Patent Application No. 2019-510407, dated Mar. 2, 2020.
(Continued)

*Primary Examiner* — Deoram Persaud
(74) *Attorney, Agent, or Firm* — Pillsbury Winthrop Shaw Pittman LLP

(57) ABSTRACT

An optical system delivers illuminating radiation and collects radiation after interaction with a target structure on a substrate. A measurement intensity profile is used to calculate a measurement of the property of the structure. The optical system may include a solid immersion lens. In a method, the optical system is controlled to obtain a first intensity profile using a first illumination profile and a
(Continued)

second intensity profile using a second illumination profile. The profiles are used to derive a correction for mitigating the effect of, e.g., ghost reflections. Using, e.g., half-moon illumination profiles in different orientations, the method can measure ghost reflections even where a solid immersion lens would cause total internal reflection. The optical system may include a contaminant detection system to control a movement based on received scattered detection radiation. The optical system may include an optical component having a dielectric coating to enhance evanescent wave interaction.

26 Claims, 10 Drawing Sheets

(52) U.S. Cl.
CPC ...... *G03F 7/70516* (2013.01); *G03F 7/70916* (2013.01); *G03F 7/70941* (2013.01)

(56) References Cited

U.S. PATENT DOCUMENTS

| | | | |
|---|---|---|---|
| 2006/0066855 A1 | 3/2006 | Den Boef et al. | |
| 2007/0296960 A1 | 12/2007 | Den Boef et al. | |
| 2009/0205090 A1 | 8/2009 | Mimouni et al. | |
| 2009/0316979 A1 | 12/2009 | Gidon | |
| 2010/0201963 A1* | 8/2010 | Cramer | G01N 21/9501 355/67 |
| 2011/0027704 A1 | 2/2011 | Cramer et al. | |
| 2012/0038910 A1* | 2/2012 | Stevens | G01N 21/00 356/237.2 |
| 2012/0123581 A1* | 5/2012 | Smilde | G03F 7/70641 700/105 |
| 2015/0198524 A1 | 7/2015 | Sapiens et al. | |
| 2016/0061590 A1 | 3/2016 | Pandey | |
| 2016/0091422 A1* | 3/2016 | Van Der Zouw | G01N 21/4738 356/445 |
| 2016/0180517 A1 | 6/2016 | Fuchs et al. | |
| 2017/0242343 A1* | 8/2017 | Pandey | G03F 7/70191 |

FOREIGN PATENT DOCUMENTS

| | | |
|---|---|---|
| JP | H11237344 | 8/1999 |
| JP | 2008003084 | 1/2008 |
| JP | 2015524554 | 8/2015 |
| WO | 2016030227 | 3/2016 |
| WO | 2016177568 | 11/2016 |

OTHER PUBLICATIONS

International Search Report and Written Opinion issued in corresponding PCT Patent Application No. PCT/EP2017/070990, dated Jan. 19, 2018.
Chinese Office Action issued in corresponding Chinese Patent Application No. 201780055481.8, dated Jun. 19, 2020.
Korean Office Action issued in corresponding Korean Patent Application No. 10-2019-7010082, dated Sep. 9, 2020.
Korean Office Action issued in corresponding Korean Patent Application No. 10-2019-7010082, dated Mar. 3, 2021.

* cited by examiner (a)

(b)

METHOD AND APPARATUS FOR DERIVING CORRECTIONS, METHOD AND APPARATUS FOR DETERMINING A PROPERTY OF A STRUCTURE, DEVICE MANUFACTURING METHOD

This application is the U.S. national phase entry of PCT patent application no. PCT/EP2017/070990, which was filed on Aug. 21, 2017, which claims the benefit of priority of U.S. provisional application No. 62/393,533, which was filed on Sep. 12, 2016, and U.S. provisional application No. 62/440,055, which was filed on Dec. 29, 2016.

FIELD

The present description relates to calibration of optical systems. Embodiments described herein may be applied, for example, in inspection apparatuses and, for example, in lithographic apparatuses usable, for example, in the manufacture of devices by lithographic techniques. Embodiments described herein may be applied for example in an inspection apparatus employing a solid immersion lens (SIL) or micro-SIL.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay (the accuracy of alignment between patterns formed in different patterning steps, for example between two layers in a device) and defocus of the lithographic apparatus. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" or a "pupil image" from which a property of interest of the target can be determined. Determination of the property of interest may be performed by various techniques: e.g. reconstruction of the target structure by iterative approaches such as rigorous coupled wave analysis or finite element methods; library searches; and principal component analysis.

Examples of scatterometers include angle-resolved scatterometers of the type described in United States patent application publication nos. US 2006-033921 and US 2010-201963. The targets used by such scatterometers are relatively large, e.g. 40 µm by 40 µm, gratings, and the measurement beam generates a spot that is smaller than the grating (i.e., the grating is underfilled). In addition to measurement of feature shapes by reconstruction, diffraction based overlay can be measured using such apparatus, as described in United States patent application publication no. US 2006-066855. Methods and scatterometers are also disclosed in United States patent application publication nos. US 2011-0027704, US 2006-033921 and US 2010-201963. With reduction of the physical dimensions in lithographic processing, there is demand to inspect smaller and smaller features, and also demand to reduce the space occupied by targets dedicated to metrology. The contents of all these applications are incorporated herein by reference.

In order to, for example, increase the range of scattering angles that can be captured, a solid immersion lens (SIL) or miniature SIL (micro-SIL) can be provided between an objective lens and the target structure. An example of an angularly resolved scatterometer comprising a solid immersion lens (SIL) is disclosed in United States patent application publication no. US 2009-316979. The extreme proximity of the SIL with the target results in a very high effective NA larger than 1, meaning that a greater range of scattering angles can be captured in the pupil image. The application of such a SIL in an inspection apparatus for semiconductor metrology is disclosed in United States patent application publication no. US 2016-061590.

To take advantage of the increasing numerical aperture, the gap between the SIL and the target needs to be set and maintained to an optimal value. For example, the gap may be a few tens of nanometers, for example within the range 10-100 nm to maintain the SIL in the near field of optical interaction with the substrate. Arrangements for controlling the height of the SIL element are described in the United States patent application publication no. US 2016-061590 and in PCT patent application no. PCT/EP2016/058640, filed Apr. 19, 2016. The contents of all the mentioned applications and patent application publications are incorporated herein in their entirety by reference. The use of a SIL can allow formation of a smaller illumination spot, and consequently may also allow the use of smaller targets.

SUMMARY

The present disclosure is applicable to calibration of optical systems generally. The present disclosure is not limited in application to any particular type of inspection apparatus, or even to inspection apparatuses generally. The principles of the present disclosure are not limited either to optical systems including SIL or micro-SIL elements. Nevertheless, the embodiments described herein find useful application in optical systems for an inspection apparatus, and in optical systems including a SIL or micro-SIL element. A problem in optical systems generally is that of radiation reflected and scattered by materials and surfaces within the optical system, which mixes with the wanted radiation in unpredictable ways and reduces contrast or introduces noise to the captured information. Accordingly, it is customary to take one or more calibration steps, so that the effects of this unwanted radiation can be corrected when images or other signals are captured for the purposes of measurement.

Considering scatterometry pupil detection as an example, an image sensor located near a back-focal plane of the optical system captures scatterometric data (a scatter spectrum) in the form of a pupil image. Along with the scatterometric data the image sensor also picks up what might be called "ghost" signals. These are caused by, e.g., reflections from surfaces within the optical system, rather than the target structure of interest. They are particularly significant when the same optical components, such as an objective lens, are used simultaneously to deliver illuminating radiation and to capture the scatterometric data after interaction with the target. One way to separate the ingoing beam from outgoing beam is to capture a pupil image with a beam dump (a radiation absorbing device) positioned in place of the target structure. The captured image is then only due to undesired reflections at the optical surfaces, and can be subtracted from future images to correct for the ghost signals. An alternative calibration method would be desirable, however. In a SIL-based optical system, for example, there may be total internal reflection within the SIL, when no target is present at a sub-wavelength distance.

Another type of calibration step may be performed to characterize transmission through the optical system. A method for this calibration is mirror calibration, using a reflective element having a well-defined reflectance. Mirror calibration can be used to compute the optical transmission of a microscope objective for varying wavelength, angle of incidence and/or incident polarization. An alternative calibration method would be desirable, however. In the case of an optical system including an objective and SIL, it may not be possible to measure transmission through the objective lens and SIL using a mirror in a mirror calibration.

Other types of calibration that can be performed in a scatterometer are to measure so-called numerical aperture scaling (NA scaling) and to locate the pupil symmetry point within captured images. Methods for these calibrations can be time-consuming and alternative methods are therefore of interest for these steps also.

The present disclosure is applicable to improving the interaction of an evanescent wave travelling at the surface of the solid immersion lens and an inspected surface of a substrate. A common problem encountered in particle detection systems is the relative large background of reflected radiation with respect to radiation scattered by contaminating particles at the surface of the substrate. The signal-to-noise ratio of the detection system is hence poor. The present disclosure proposes a solution to this problem.

The present disclosure is applicable to protecting collision of the solid immersion lens with particles or structures on the surface of the inspected substrate.

According to an aspect, there is provided a method of deriving a correction for an optical system, the optical system being operable for both delivering illuminating radiation to a target structure and collecting radiation after interaction with the target structure, the method comprising:

obtaining a first intensity profile representing radiation collected by the optical system while illuminating a pupil of the optical system in accordance with a first illumination profile;

obtaining a second intensity profile representing radiation collected by the optical system while illuminating the pupil of the optical system in accordance with a second illumination profile different from the first illumination profile; and using the first and second intensity profiles to derive a correction for mitigating the effect of interaction of the illuminating radiation with the optical system, as opposed to interaction with a target structure.

Using intensity profiles detected using different illumination profiles, the method effectively separates the effect of ghost reflections from different parts of the optical system, so that a correction can be calculated.

In some embodiments, different portions of the first and second intensity profiles are used to synthesize an intensity profile representing the effect of interaction of the illuminating radiation with the optical system.

The method can be applied to obtain corrections in the case of optical systems including SIL components, where existing methods might fail. Where the different illumination profiles have different portions of light and dark, the effect of total internal reflection can be confined to a specific part of the pupil in each intensity profile.

According to an aspect, there is provided a method of determining a property of a structure, the method comprising deriving one or more corrections by a method as set forth above, and further comprising:

receiving a measurement intensity profile representing radiation collected by the optical system after interaction with the structure; and calculating a measurement of the property of the structure based at least partly on the measurement intensity profile, and using the derived correction.

According to an aspect, there is provided a method of controlling a movement of an optical system with respect to a measurement surface, the optical system being operable to both deliver illuminating radiation to the measurement surface and collecting radiation after interaction with the measurement surface, the method comprising:

illuminating the measurement surface with detection radiation;

receiving detection radiation scattered by the measurement surface; and controlling the movement of the optical system based on the received scattered detection radiation.

According to an aspect, there is provided an apparatus configured to perform a method of controlling a movement of an optical system in accordance with a method as set out herein.

According to an aspect, there is provided an optical system for inspection of a surface, the optical system being configured to deliver illuminating radiation to the surface and collect radiation after interaction with the surface, the optical system comprising at least one optical element provided with a dielectric coating configured to enhance an evanescent wave interaction between the optical element and the surface.

According to an aspect, there is provided an apparatus for deriving a correction for an optical system, the optical system being operable for both delivering illuminating radiation to a target structure and collecting radiation after interaction with the target structure, the apparatus comprising a processor configured to:

receive a first intensity profile representing radiation collected by the optical system while illuminating a pupil of the optical system in accordance with a first illumination profile;

receive a second intensity profile representing radiation collected by the optical system while illuminating the pupil of the optical system in accordance with a second illumination profile different from the first illumination profile; and derive using the first and second intensity profiles a correction for mitigating the effect of interaction of the illuminating radiation with the optical system, as opposed to interaction with a target structure.

The processor may be further configured to:

receive a measurement intensity profile representing radiation collected by the optical system after interaction with a structure of interest; and calculate a measurement of the property of the structure based at least partly on the measurement intensity profile, and using the derived correction.

According to an aspect, there is provided an inspection apparatus comprising an optical system, a control system for the optical system and an apparatus as set forth above, the control system being configured to control the optical system to obtain the first and second intensity profiles, to obtain the measurement intensity profile from the structure of interest and, if applicable, to obtain a further intensity profile and third and fourth intensity profiles and to deliver the intensity profiles to the processor for use in deriving the correction and calculating a property of the structure of interest.

The steps disclosed herein can be performed in any order that the context permits, and need not be performed in the order specified. Thus, for example, it is a matter of choice whether the intensity profiles for use in deriving the correction are received before or after the measurement intensity profile is received. The same principle applies to the sequence in which the optical system is operated to obtain the intensity profiles.

According to an aspect, there is provided a computer program product containing one or more sequences of machine-readable instructions for causing a processing system to derive a correction by a method as described herein. The computer program product may comprise a non-transient storage medium.

According to an aspect, there is provided a method of manufacturing devices including a lithographic process step, wherein, before or after performing the lithographic process step, measurements of structures on a substrate are obtained by a method as described herein, and wherein the obtained measurements are used to adjust a parameter of the lithographic process step for the processing of the substrate and/or further substrates.

These and other aspects will be made apparent to the skilled reader from a consideration of the examples described below.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Before describing embodiments in detail, it is instructive to present an example environment in which embodiments may be implemented.

Figure 1:
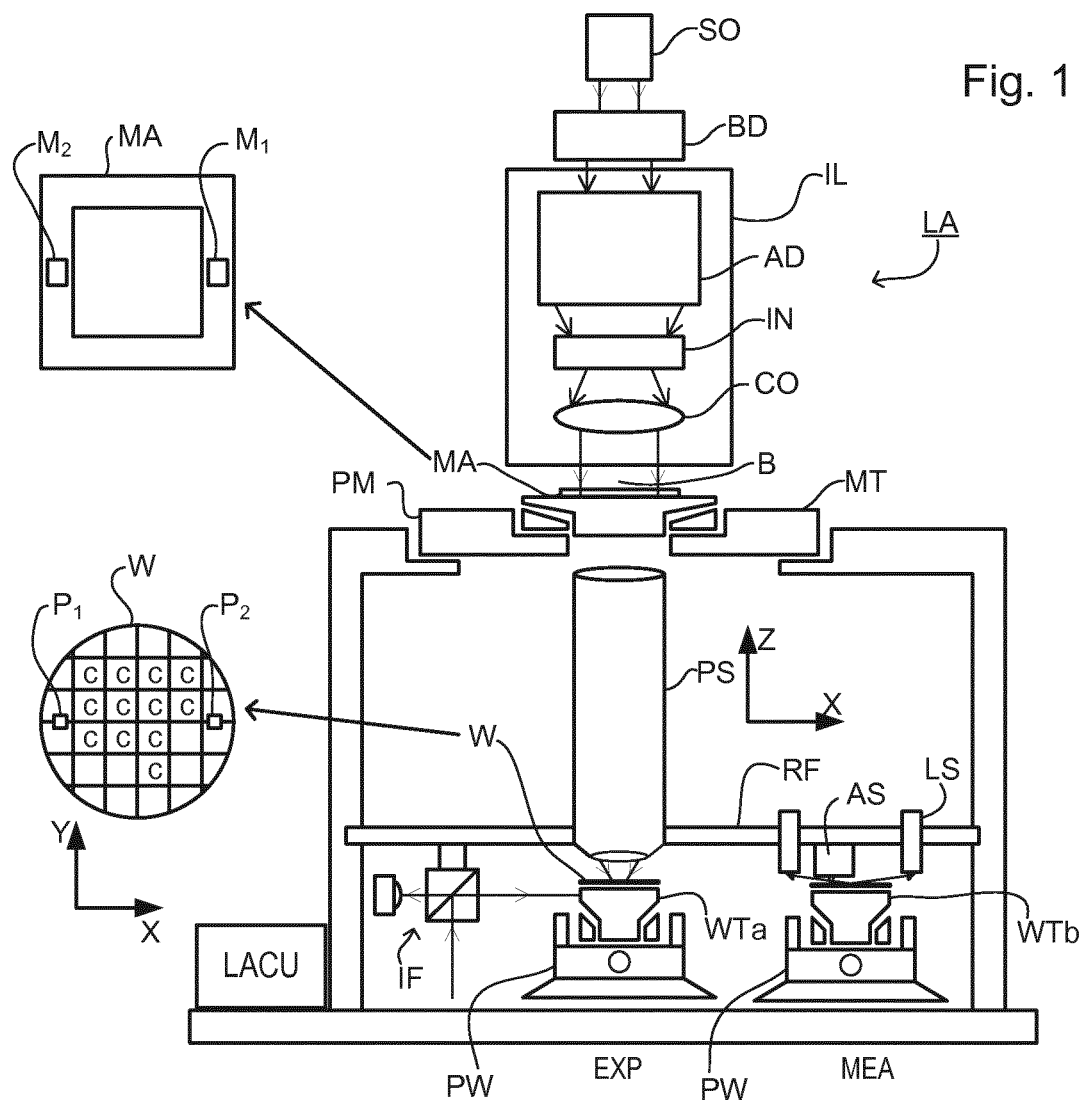
FIG. 1 depicts a lithographic apparatus.

FIG. 1 schematically depicts a lithographic apparatus LA. The apparatus includes an illumination system (illuminator) IL configured to condition a radiation beam B (e.g. UV radiation or DUV radiation), a patterning device support or support structure (e.g. a mask table) MT constructed to support a patterning device (e.g. a mask) MA and connected to a first positioner PM configured to accurately position the patterning device in accordance with certain parameters; two substrate tables (e.g. a wafer table) WTa and WTb each constructed to hold a substrate (e.g. a resist coated wafer) W and each connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g., after mechanical retrieval from a mask library, or during a scan.

Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies. Small alignment marks may also be included within dies, in amongst the device features, in which case it is desirable that the marks be as small as possible and not require any different imaging or process conditions than adjacent features. The alignment system, which detects the alignment marks, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e. a single dynamic exposure). The speed and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual-stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment marks on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems.

Figure 2:
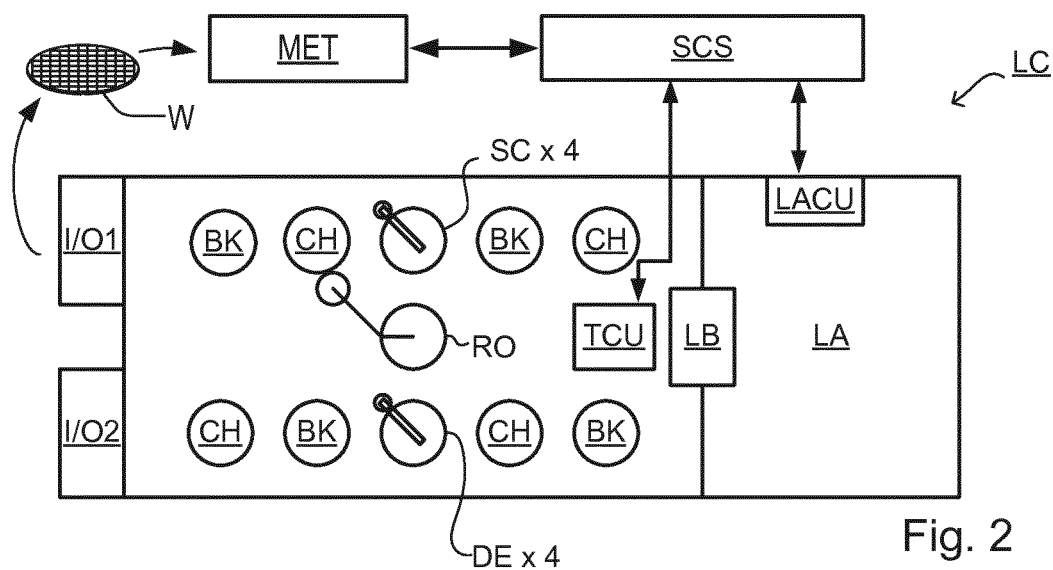
FIG. 2 depicts a lithographic cell or cluster in which an inspection apparatus as described herein may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include one or more spin coaters SC to deposit resist layers, one or more developers DE to develop exposed resist, one or more chill plates CH and/or one or more bake plates BK. A substrate handler, or robot, RO, picks up substrates from input/output ports I/O1, I/O2, moves them between the different process apparatus and delivers them to the loading bay LB of the lithographic apparatus. These devices, which are often collectively referred to as the "track", are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay error between subsequent layers, line thickness, critical dimension (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If an error is detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
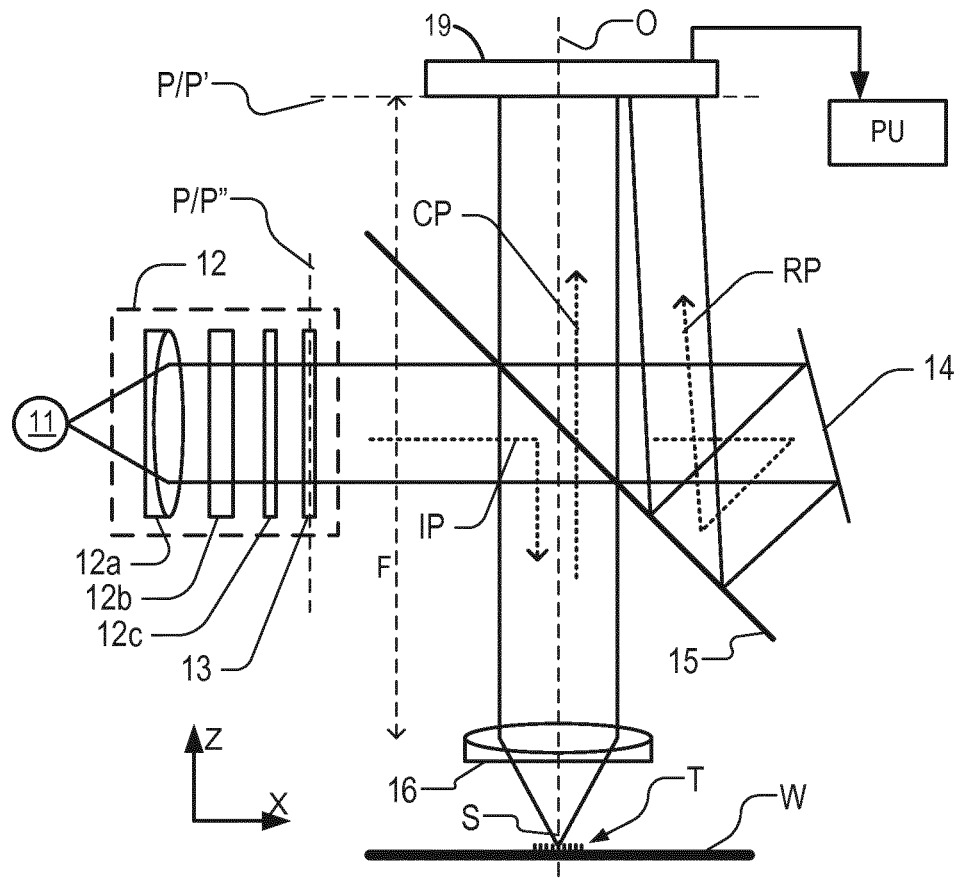
FIG. 3 depicts an example of an inspection apparatus configured to perform angle-resolved scatterometry, as an example of an optical system in which embodiments described herein may be applied.

FIG. 3 shows the basic elements of an angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16 has a high numerical aperture (NA), desirably at least 0.9 and more desirably at least 0.95. Immersion fluid can be used to obtain numerical apertures over 1 if desired. Further increases in NA can be obtained by use of solid immersion lens (SIL) techniques, including micro-SIL and equivalents.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system are being brought to different locations on the substrate, when in practice the optical system remains substantially stationary and only the substrate moves. Provided the relative position of the substrate and the optical system is correct, it does not matter in principle whether one or both of those are moving in the real world.

Part of the radiation beam is transmitted through the partially reflecting surface 15 and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the pupil plane P of lens 16, which is at the back-focal length F of the lens 16. In practice, the pupil plane itself may be inaccessible, and may instead be re-imaged with auxiliary optics (not shown) onto the detector located in a so-called conjugate pupil plane P'. The pupil plane P may also be referred to as the back focal plane. The detector may be a two-dimensional detector so that a two-dimensional angular scatter spectrum or diffraction spectrum of a substrate target T can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

Returning to the apparatus, the various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P'' conjugate with pupil plane P of objective lens 16 and the plane of the detector 19. In this way, an illumination profile defined by the aperture device defines the angular distribution of radiation incident on substrate radiation passing through different locations on aperture device 13.

The detector 19 may measure the intensity of scattered radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic-polarized radiation and transverse electric-polarized radiation.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to optical effects in the lithographic projection apparatus, particularly the projection system PS. For example, illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes. The techniques disclosed herein are not limited to inspection of grating structures, and any target structure, including a blank substrate or a substrate having only flat layers on it, or a substrate with an isolated structure (for example contamination or other defects) is included within the term "target structure".

In addition to measurement of parameters by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement using the instrument of FIG. 3 are described for example in U.S. patent application publication no. US 2006-066855 cited above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 3, where detector 19 may be an image sensor, such asymmetry in the diffraction orders appears directly as asymmetry in the pupil image recorded by detector 19. This asymmetry can be measured by digital image processing in unit PU, and calibrated against known values of overlay.

Calibration Background

Figure 4:
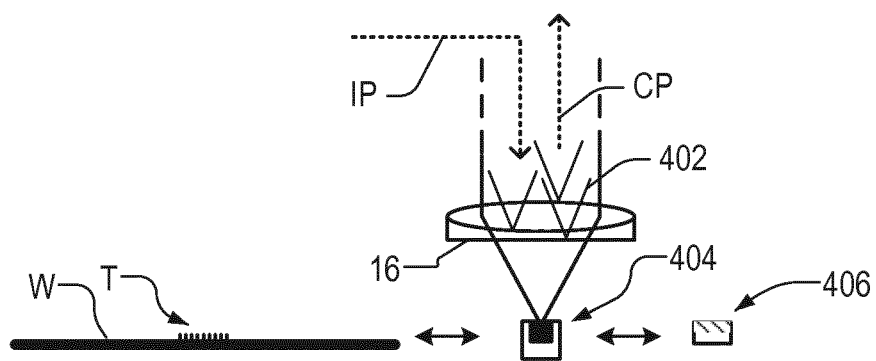
FIG. 4 illustrates calibration steps in a method using a beam dump and a fiducial reflector.

FIG. 4 illustrates steps in certain calibration procedures that can be used with the type of scatterometer illustrated in FIG. 3. Similar calibration procedures may be applied in other type of inspection apparatus, and in other types of optical systems generally. The optical system of the inspection apparatus of FIG. 4 is presented as an example only.

Ghost image calibration is a first type of calibration considered in this disclosure. Ghost images are unwanted optical signals that are detected by the detector 19 due to spurious reflections 402 from, e.g., optical elements of the scatterometer, independent of the presence of target T or any substrate W. At any interface between materials of differing refractive indices, Fresnel reflections are likely to occur. The optical surfaces in a high-performance optical system are likely to be provided with sophisticated anti-reflective coatings, to reduce Fresnel reflections. Nevertheless, a small portion of radiation passing through an interface is inevitably reflected. All the reflected rays contribute to a so-called "ghost image" being captured by detector 19. It should be remembered that the optical system in a real inspection apparatus will comprise a significant number of optical elements, compared with the simple lens 16 illustrated. The high-NA microscope objective lens 16, due to its construction, is a prominent source of ghost images. Ghost images contaminate the measurement signals for the CD/overlay determination. High incident power is desired in the scatterometry applications for high signal to noise values. The intensities of the ghost images are a function of the incident optical power, and can therefore reach a significant proportion of measurement signal intensity.

To calibrate the apparatus for ghost images, the optical system can be focused on a beam dump 404, as illustrated in FIG. 4. As a beam dump, any radiation-absorbing device can be used. An image captured by sensor 19 when the beam dump is present can be used as a measure of the ghost images. A correction can then be defined, so that the ghost image is effectively subtracted from images captured using targets T of interest.

A further type of calibration is transmission calibration, particularly for transmission of the microscope objective lens 16. An angle resolved scatterometer optical system, specifically microscope objective lens 16, has an optical transmission that is dependent on wavelength, angle and polarization. The transmission is calibrated in order to establish the target's reflectivity from a measured intensity. CD reconstruction, for example, often relies on these calibrated reflectivities. Calibration of transmission can be done by "mirror calibration" using one or more specially designed "fiducial" mirrors such as the reference mirror 406 shown in FIG. 4.

Further calibration procedures can be used for pupil symmetry point (PSP) and numerical aperture (NA) scaling. In applications such as CD reconstruction, mismatch between the observed far field and the simulations should be minimized for CD reconstruction. For calibration, therefore, the actual value of NA of the optical system is determined and also the NA scaling per pixel of detector 19. Similarly the center of the experimental data (pupil symmetry point) is determined. This can be done through "Brewster eyes" measurement (determining position of minimum reflectivity at Brewster's angle) on fiducial mirror 406. The fiducial mirror acts as a reference, being made of material having a known reflectivity over angle, wavelength and polarization.

Using the positioning systems mentioned above, reference targets such as the beam dump 404 and one or more reference mirror 406 can be swapped in and out of position in place of target T. This is readily achieved by mounting them on the substrate support, just outside the area occupied by the substrate itself.

Optical Systems with Solid Immersion Lens (SIL)

Figure 5:
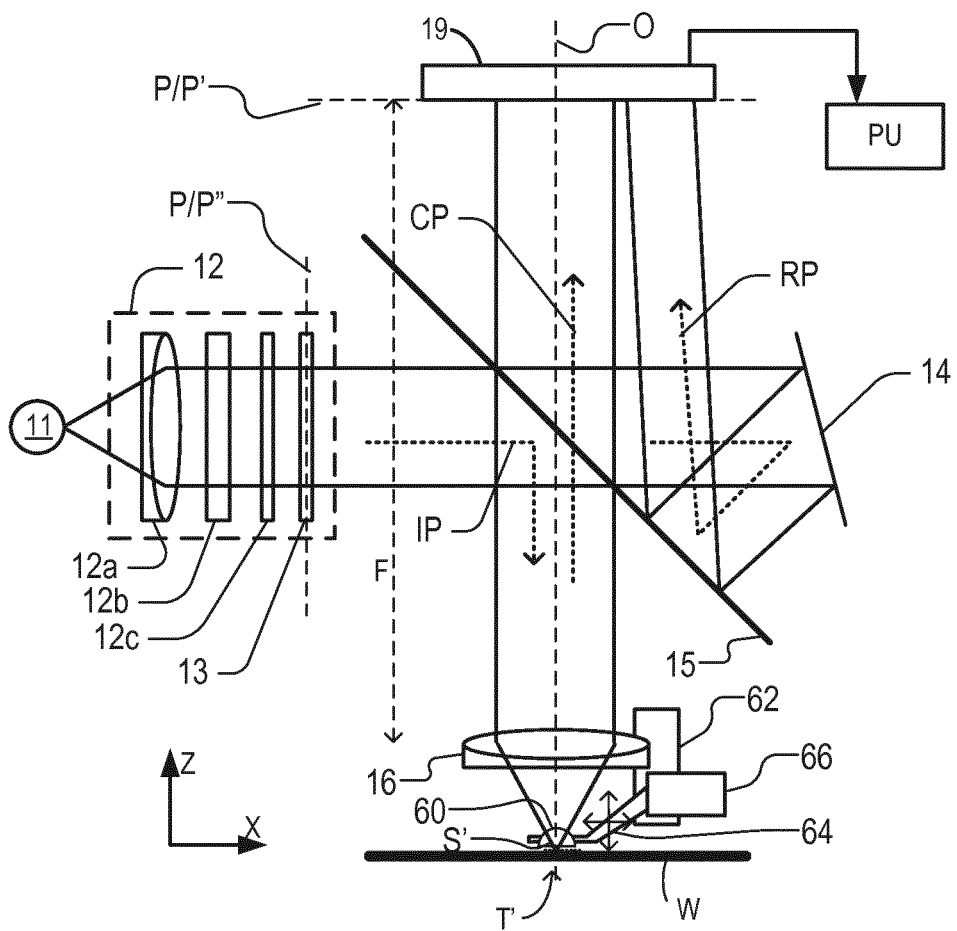
FIG. 5 depicts an example of an inspection apparatus configured to perform angle-resolved scatterometry, in which an optical system includes a solid immersion lens (SIL), as another example of an optical system in which embodiments described herein may be applied.

FIG. 5 shows a modified version of the scatterometer of FIG. 3, in which a smaller spot S' of illumination can be applied to a smaller grating target T', which has lines of smaller pitch. Components are labeled the same as in the scatterometer of FIG. 3.

Comparing the apparatus of FIG. 5 with that of FIG. 3, a first difference is the provision of an additional lens element 60 close to the target T'. This additional lens is a miniature solid immersion lens (SIL), with a cross-sectional width (e.g., diameter) only on the order of millimeters, for example in the range of 1 mm to 5 mm, for example about 2 mm. This comprises in one example a hemisphere of material such as glass of refractive index n that receives rays of radiation at normal incidence to its surface. These rays come to focus at the center of the hemisphere and form a diffraction-limited spot that is smaller by a factor of n compared to what it would have been in the absence of the SIL. A typical glass hemisphere having n=2 will reduce the cross-sectional width (e.g., diameter) of the focused spot by a factor of 2. Immersion of lenses in liquid has been used to increase resolution in microscopy and photolithography. The solid immersion lens has been proposed in microscopy and in lithography as a way of achieving similar gains without the inconvenience of liquid immersion.

Benefits of inspection using an apparatus comprising a SIL and coherent radiation are described for example in United States patent application publication nos. US 2009-316979 and US 2016-061590, cited above. However, to help ensure that the smaller spot size does indeed increase the resolution of the system, the bottom of the hemisphere should either be in contact with the target T' or positioned extremely close to it, within a fraction of a wavelength of the inspection radiation. This restricts its practical applications.

So-called micro-SIL lenses may also be used, of which the cross-sectional width (e.g., diameter) is many times smaller, for example about 2 microns in diameter instead of about 2 millimeters. In an example where SIL 60 in the FIG. 5 apparatus is a micro-SIL lens, it may have a cross-sectional width (e.g., diameter) less than 10 um, potentially less than 5 um.

Whether a miniature SIL 60 or a micro-SIL lens is used, it can be attached to a movable support so that control of the alignment and proximity of the SIL 60 to the sample is simpler than in the case of a lens with bigger cross-sectional width. SIL 60 in FIG. 5 is mounted to a frame 62 supporting objective 16, via an arm 64 and actuator 66. Actuator 66 may be piezoelectric in operation, for example, or voice-coil actuated. It may operate in combination with other actuators positioning the objective as a whole in relation to the target. In relation to the coarse and fine positioners mentioned above, for example, the actuator 66 and arm 64 may be regarded as an ultra-fine positioner. The skilled person will appreciate that servo control loops of these different positioners can be integrated with one another in a manner that need not be described here. The components 62, 64 and 66, together with the substrate table and positioners (mentioned above but not shown), form a support apparatus for positioning the SIL and the target T' in close proximity to one another. In principle, SIL 60 could be mounted rigidly to the frame 62, and/or may be of bigger diameter. The separate arm and actuator allow easier control of the very small gap, as discussed below.

The form of the mounting arm 64 and actuator 66 illustrated here are purely schematic. A practical implementation of a mounting and actuator 66 is described in the PCT patent application PCT/EP2016/058640, mentioned above.

Inclusion of the SIL 60 opens the possibility of focusing to a much smaller spot S'. As mentioned, the SIL works by capturing the near-field radiation from the target, and to this end it is positioned substantially closer than one wavelength ($\lambda$) of radiation from the target structure, generally closer than a half wavelength, for example around $\lambda/20$. The closer the distance, the stronger will be the coupling of near-field signals into the instrument. The gas gap between SIL 60 and target T' may therefore be less than 100 nm, for example between 10 nm and 50 nm. Because the NA of the scatterometer is effectively increased, the pitch of the target grating can also be reduced closer to product dimensions, while still capturing a large angular spectrum of the diffraction signals. Alternatively, the pitch can be maintained while capturing a larger angular range of the diffraction signal.

In examples where a micro-SIL would be used, incoherent radiation of the type conventionally used in the scatterometers cannot be focused to a micron-sized spot as small as the micro-SIL. Accordingly, in such an embodiment, the radiation source 11 may be a coherent source such as a laser. A laser source may be coupled to illumination system 12 via an optical fiber. The limit on the spot size is set by the numerical aperture of the focusing lens system and the laser wavelength. As mentioned in United States patent application publication no. US 2016-061590, the instrument with laser radiation source can be used to perform different types of scatterometry, for example, coherent Fourier scatterometry (CFS).

Calibration Issues with a SIL

As already mentioned, the present disclosure is not limited in application to optical systems having SIL or micro-SIL elements in front of an objective lens, but the present disclosure does aim to address certain issues that arise particularly in the calibration of optical systems with SIL elements.

Referring to the ghost image calibration, as stated above, the ghost signals are the spurious reflections in the optical system, which end up in the detected pupil image. Almost all the incident radiation on the objective lens 16 is transmitted through the objective lens 16, and without a SIL can be absorbed in a beam dump for calibration measurement. With the SIL 60 present, however, not all the angles of rays incident on the SIL are transmitted through the SIL. On the contrary, total internal reflection (TIR) occurs for rays above a critical angle of incidence, depending on the relative refractive index of the SIL and the surrounding medium.

Figure 6:
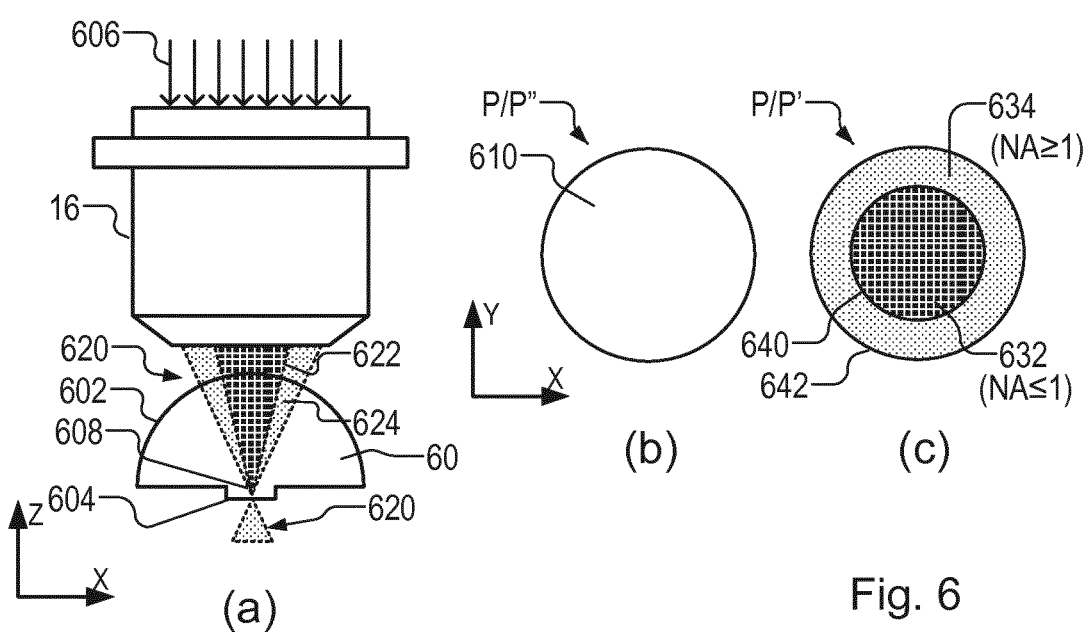
FIG. 6(a), FIG. 6(b) and FIG. 6(c) show in more detail characteristics of the optical system of the apparatus of FIG. 5, including the solid immersion lens.

FIGS. 6(*a*)-6(*c*) illustrate this phenomenon in more detail. In the X-Z cross-section for FIG. 6(*a*), SIL 60 is shown having a hemispherical upper surface 602 facing objective lens 16 and with a planar lower surface 604 facing the target T'. Rays 606 of illuminating radiation are focused by lens 16 to a focal point 608 inside the SIL 60, nominally positioned at lower surface 604. Methods and apparatuses for controlling this focusing are described in PCT patent application PCT/EP2016/058640 mentioned above.

FIG. 6(*b*) shows schematically an illumination profile 610 in the plane P/P''' in FIG. 5. FIG. 6(*c*) shows schematically a distribution of collected radiation in the plane P/P', assuming no target structure is in the vicinity of SIL 60. If the illumination profile 610 is a full, circular distribution as shown, then a cone of rays 620 is formed by the focusing action of objective lens 16, as seen in the X-Z cross-section of FIG. 6(*a*). This cone of rays includes a central portion 622 in which rays meet the lower surface 604 of SIL 60 at angles below the critical angle for total internal reflection. The cone of rays also includes an outer portion 624 in which rays meet the lower surface 604 of SIL 60 at angles above the critical angle for total internal reflection.

The critical angle is defined by the equation:

$$\theta_c = \sin^{-1}\left(\frac{n_2}{n_{sil}}\right)$$

where $n_2$ is the surrounding medium (assumed to be air) and $n_{sil}$ is the refractive index of the SIL. The boundary where the critical angle occurs corresponds (by definition) to an NA of 1 in the overall system of lens 16 and SIL 60.

In the presence of a target structure very close to the lower surface 604 of SIL 60, the total internal reflection is frustrated, and rays 620 from both portions of the illumination cone 620 can interact with the target structure. This gives the overall system of lens and SIL an NA greater than 1. In the absence of a target structure, however, the rays in the outer cone experience total internal reflection at the lower surface 604 of SIL 60, and are strongly reflected back towards objective lens 16. FIG. 6(*c*) shows how the collected radiation in plane P/P' includes a dark central region 632, corresponding to NA values below 1. Here, most rays have passed out of the SIL 60 and only the ghost image caused by Fresnel reflections is present. In a bright outer region 634 corresponding to NA values greater than 1, most rays have been reflected back by total internal reflection. The ghost image is also present, but is swamped by the total internal reflection. Consequently, the calibration method of FIG. 4 fails, because detector 19 cannot capture the ghost image correctly, even when a beam dump 404 would be placed beneath the SIL 60. An alternative solution is required.

Referring to the step of transmission calibration, it was described above how mirror calibration can be used to compute the optical transmission of the microscope objective for varying wavelength, angle and incident polarization. This calibration method also fails when using a combination of objective lens 16 and SIL. The SIL is placed at the focal plane of the objective lens 16. Optical transmission through this "hyper NA" lens system cannot be measured simply by using a fiducial reference mirror 406. An alternative solution is required.

Further, methods exploit a polarization phenomenon known as the Brewster angle, to calibrate NA scaling and pupil symmetry point. At the Brewster angle, the reflectivity of a sample vanishes under some illumination conditions of polarization and angle. The calibration method involves measurement using two orthogonal incident polarizations at each wavelength for the NA scaling and PSP measurement. This is time consuming. An alternative solution which is less time-consuming would be of interest.

Alternative Method for Ghost Image Correction

In a calibration method disclosed herein, it is proposed to separate the radiation that is reflected due to total internal reflection at the bottom surface of SIL 60, from the "ghost" radiation that is reflected back from curved surfaces of the SIL and/or other optical elements. The ghost image, in the method now disclosed, is synthesized from two or more partial ghost images, captured under different illumination conditions. Specifically, calibration measurements are performed two or more times, each time illuminating only a portion of a pupil of the optical system with the illuminating radiation. In other words, the illumination profile in each measurement has dark regions. These dark regions are at least partly positioned diametrically opposite bright regions. This means in particular that ghost reflections can be detected in the NA>1 regions, where the total internal reflection would otherwise dominate and obscure the ghost reflections.

Figure 7:
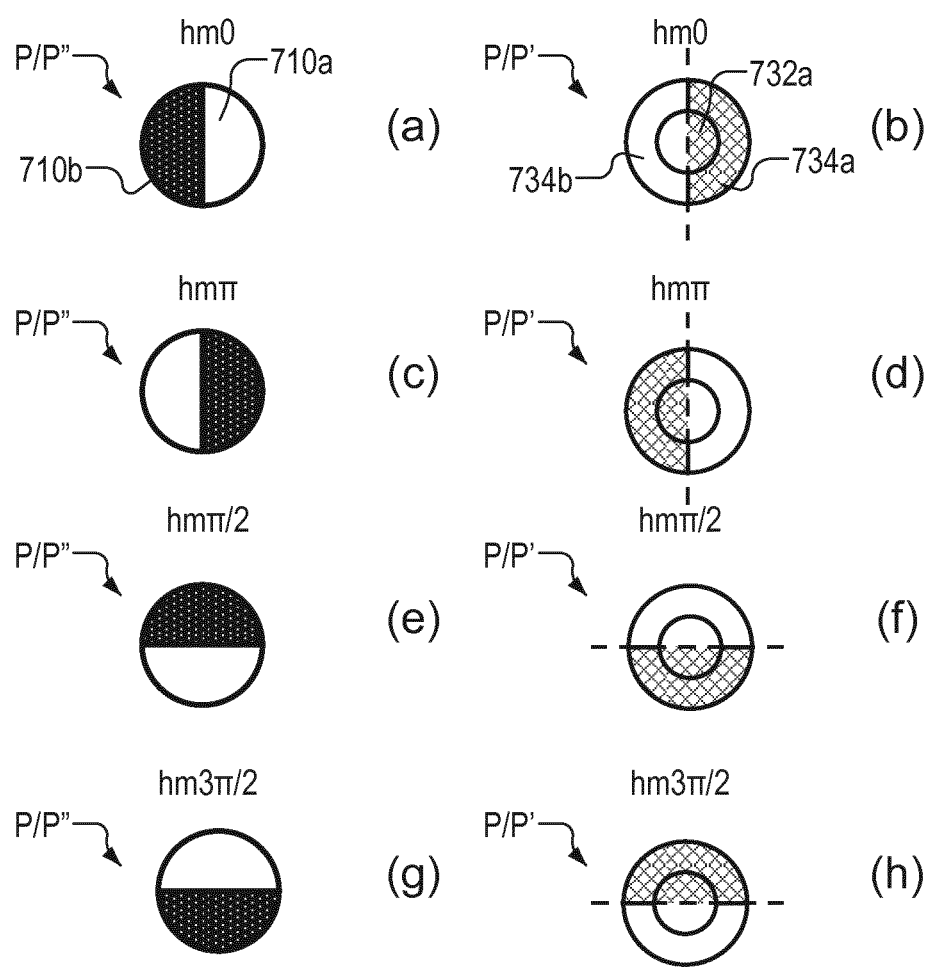
FIG. 7(a), FIG. 7(b), FIG. 7(c), FIG. 7(d), FIG. 7(e), FIG. 7(f), FIG. 7(g) and FIG. 7(h) illustrate illumination modes and detection modes in steps of a calibration method for the apparatus of FIGS. 5 and 6.

FIGS. 7(*a*)-7(*h*) illustrate one example of this proposed method, based on four measurement steps. Each measurement step in this example uses a "half-moon" aperture in the aperture device 13, to produce an illumination profile having a bright half 710*a* and a dark half 710*b*. FIGS. 7(*a*) and 7(*b*) show how the situation differs from that of FIGS. 6(*a*) and 7(*b*) in a first measurement step of the calibration method. FIGS. 7(*c*) and 7(*d*) show the same for a second measurement step, FIGS. 7(*e*) and 7(*f*) show a third measurement step and FIGS. 7(*g*) and 7(*h*) show a fourth measurement step. In each step, the orientation of the half-moon aperture is rotated by 90 degrees ($\pi/2$ radians). The orientations of the half-moon are thus conveniently labeled hm0, hm$\pi$, hm$\pi/2$ and hm$3\pi/2$.

Considering the first step (hm0), FIGS. 7(*a*) and 7(*b*) show schematically the incident illumination at the entrance pupil of the objective lens 16 (plane P/P''') and the image of the back focal plane (P/P') in different regions with NA≤1 and NA≥1. When the lens 16 is focused on SIL 60's lower surface 604 and either the target is far away (>>2) or replaced by a beam dump 404, the radiation in central and outer regions of the detected pupil image now depends on whether a region corresponds to the bright half of the illumination profile or the dark half.

FIG. 8(a) shows schematically an example of a pupil image captured by a detector 19, in the first step of the method of FIG. 7. The drawing is based on an experimental image. The regions 732a, 732b 734a, 734b are labeled the same way as in FIG. 7(b). This image can be visualized in a rotated form, corresponding to each of the steps FIG. 7(b), FIG. 7(d), FIG. 7(f) and FIG. 7(h). For reasons that will be explained further below, the experimental image was 45 degrees rotated from this. FIG. 8(b) shows the detected intensity profile in the experimental image, along the line B-B' indicated in FIG. 8(a). It can be seen that the intensity and the variation of intensity in the ghost image regions 732a and 734a is many times less than the bright total internal reflection in region 734b.

Figure 8:
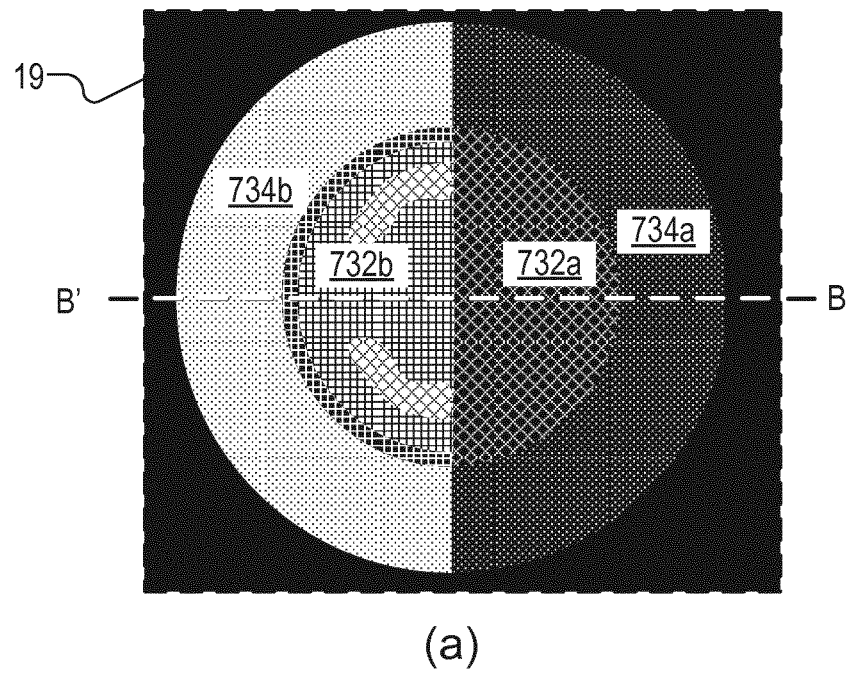
FIG. 8(a) illustrates schematically the form of a pupil image captured in a step of the calibration method of FIG. 7.
FIG. 8(b) illustrates an intensity profile along the line B-B' in a real pupil image of the type illustrated in FIG. 8(a)
Figure 8:
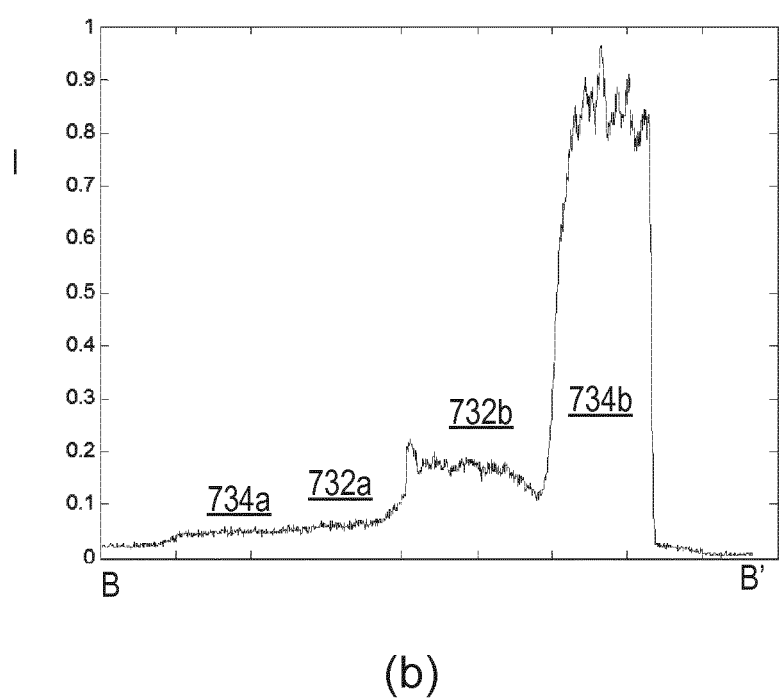

Referring then to FIGS. 7 and 8 together, a first central region 732a in the detected intensity profile corresponds to the dark portion of the illumination profile, with NA≤1. However, ghost radiation can be detected in that region 732a, comprising back-reflected radiation from surfaces that are transmitting the bright half 710a of the illumination profile (including for example Fresnel reflections from the upper surface 602 of SIL 60). Strong radiation in the region 734b of NA≥1 is always present due to the total internal reflection of radiation from the bright half 710a of the illumination profile, but this region can be ignored in the ghost image calibration measurements. What is more useful in the ghost image calibration is back-reflected radiation in the outer region 734a which corresponds to the dark half 710b of the illumination profile, with NA>1. The absence of total internal reflected radiation in this region allows a portion of the ghost image (including for example Fresnel reflections from the upper surface 602 of SIL 60) to be captured.

Repeating this measurement step using different orientations of the aperture device 13 and illumination profile allows different portions of the desired ghost image to be captured, each one free of total internal reflected radiation. These different portions can be combined to synthesize a single ghost image for use in correcting future measurements.

Figure 9:
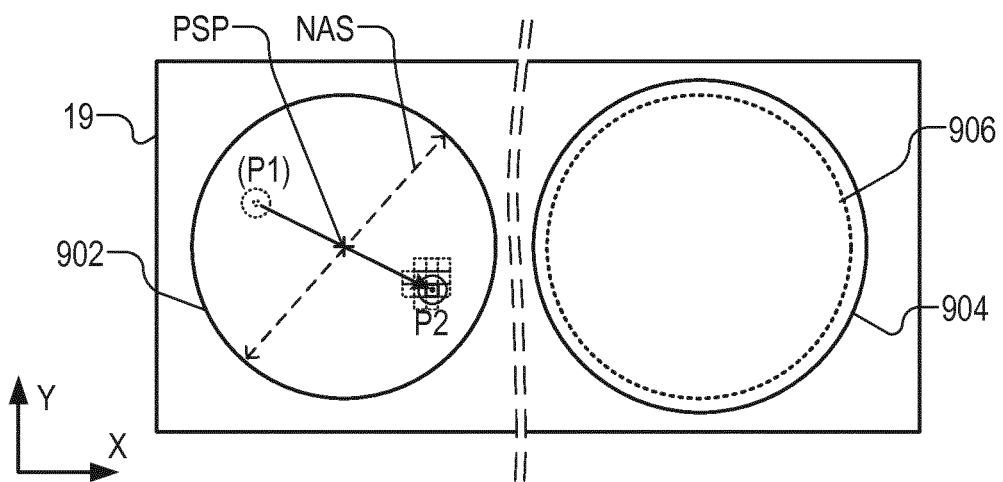
FIG. 9 illustrates capture of a scatterometry pupil image and a reference pupil image on an image sensor of the apparatus of FIG. 5.

FIG. 9 shows the layout of the pupil image detector 19, shown in FIG. 9 (see also FIGS. 3 and 5). The detector is assumed to provide an array of square pixels, each comprising a photodetector. The number of pixels in each direction may be 1000 or 2000, for example. A region 902 corresponds to the image of the back focal plane, in the collection path CP. In region 902 the pupil images sketched in FIG. 7(b), FIG. 7(d), FIG. 7(f), FIG. 7(h) and FIG. 8(a) will be captured. A few pixels (not to scale) are indicated around points P1 and P2 which will be mentioned further below. Another region 904 is arranged to receive the reference radiation from reference path RP (FIG. 5). The regions 902 and 904 may be scaled differently in practice, depending on whatever magnification and de-magnification is designed into the optical system. Assuming for the sake of simplicity that the regions 902 and 904 are scaled equally, the region 904 may be slightly larger in width (e.g., diameter) than the region 902, because the reference path is not clipped by the physical opening of the objective lens 16 in the illumination path IP and collection path CP. A dashed region 906 indicates that portion of the region 904 that maps directly to the region 902.

A detailed mathematical formulation of the problem and the expression for ghost-corrected images will now be presented. The following notations are defined:

(x, y): Rectangular coordinate of pixels on the detector 19 (CCD chip or similar).

$I_{dc}$: A DC offset of the detector 19 at each pixel.

$I_{dc}^s$: A DC offset in the sensing region 902 of the detector 19.

hm0, hmπ, $$hm\frac{\pi}{2}, hm\frac{3\pi}{2}:$$

The superscripts indicate the different aperture orientations.

$$I_{dc}^{hm0} = I_{dc}^{hm\pi} = I_{dc}^{hm\frac{\pi}{2}} = I_{dc}^{hm\frac{3\pi}{2}}:$$

Scalar DC offset applicable for all aperture orientations.

$I^{br}$ is the back reflection contribution for a specific half-moon aperture, corresponding to the regions 732a and 734a in FIG. 8(a).

$N_s$ & $N_r$: Total numbers of pixels in sensing region 902 and reference region 906 respectively on the detector 19.

$f_{nl}$: This is a pixel-dependent non linearity factor. The influence of this factor is dependent on the pixel intensity, in a known manner.

$$k = \frac{t}{t_{gh}}$$

is a scaling factor corresponding to difference in exposure time of data acquisition for the ghost image measurement ($t_{gh}$) and a measurement on a real target (t).

$I_{raw}$ is the "raw" image captured by the detector 19 in a measurement.

$I_{gh}^{tot}$ is a synthesized ghost image, corrected for dc offset and non-linearity effects.

$I^{br}$ (x, y) represents the ghost image reflected back from the optics including surfaces of the objective lens 16 and the SIL's hemispherical upper surface 602. Combining these ghost images for the different illumination profiles allows a complete ghost image to be synthesized.

Consider the ghost intensity with the half-moon aperture in various orientations, namely: hm0, hmπ, $$hm\frac{\pi}{2}, hm\frac{3\pi}{2}.$$

the DU onset is we same for all orientations.

$$I_{dc}^s = I_{dc}^{hm0} = I_{dc}^{hm\pi} = I_{dc}^{hm\frac{\pi}{2}} = I_{dc}^{hm\frac{3\pi}{2}} = \frac{\sum_{x,y}^{N_s} I_{dc}(x, y)}{N_s} \quad (1)$$

Then the ghost image intensities recorded in the regions 732a and 734a of the sensing region 902 in each of the four calibration measurement steps can be written as follows:

$$I_{gh}^{hm0}(x, y) = I^{br0}(x, y) + I_{dc}^{hm0} \qquad (2)$$

$$I_{gh}^{hm\pi}(x, y) = I^{br\pi}(x, y) + I_{dc}^{hm\pi} \qquad (3)$$

$$I_{gh}^{hm\frac{\pi}{2}}(x, y) = I^{br\frac{\pi}{2}}(x, y) + I_{dc}^{hm\frac{\pi}{2}} \qquad (4)$$

$$I_{gh}^{hm\frac{3\pi}{2}}(x, y) = I^{br\frac{3\pi}{2}}(x, y) + I_{dc}^{hm\frac{3\pi}{2}} \qquad (5)$$

The DC and non-linearity corrected ghost image can be calculated from the above measurements by the formula:

$$I_{gh}^s(x, y) = \frac{1}{2} \begin{pmatrix} (I_{gh}^{hm0}(x, y) - I_{dc}^s)f_{nl} + \\ (I_{gh}^{hm\pi}(x, y) - I_{dc}^s)f_{nl} + \\ (I_{gh}^{hm\frac{\pi}{2}}(x, y) - I_{dc}^s)f_{nl} + \\ (I_{gh}^{hm\frac{3\pi}{2}}(x, y) - I_{dc}^s)f_{nl} \end{pmatrix} \qquad (6)$$

where $I_{dc}^s$ the DC offset of the CCD and $f_{nl}$ is the exposure time vs intensity non-linearity stored in the lookup table for each pixel at varying intensity. The factor ½ arises because four images are combined, each covering a half of the pupil area. If the number and coverage of the different profiles is modified, the factor can be adjusted appropriately.

This image $I_{gh}^s$ (x, y) is saved for use in correcting measurements on real targets T'. In practice, the calibration measurements and calculations are performed in this way for each different combination of wavelength (λ) and incident polarization that may be used in the measurement on real targets.

The procedures of DC-offset and non-linearity computation are matters of detailed implementation within the abilities of the person skilled in the art. Non-linearity can be corrected for example using a look-up table.

Having obtained the synthesized ghost image, pupil images measured with targets T' close by the SIL surface 604 can be corrected for ghost reflections as follows.

Assume that the measurements used to calculate ghost image $I_{gh}^s$(x, y) are made at a maximum exposure $t_{gh}$ (avoiding saturation of CCD or other detector 19) for (say) two incident polarizations labeled H and V, and a number of incident wavelengths (λ).

Then suppose that a raw pupil image is captured from a target T' with an exposure time $t_r$. To obtain a corrected pupil image for the target, the ghost image having the appropriate combination of polarization and wavelength is subtracted from the sensor image with a scaling factor $$k = \frac{t_r}{t_{gh}}.$$

Let $I_{raw}$ be the raw image data measured from the target. Then the ghost calibrated target image $i_{target}^{gc}$ can be calculated as:

$$I_{target}^{gc}(pol,\lambda) = (I_{raw}(pol,\lambda) - I_{dc}^s)f_{nl} - kI_{gh}^s(pol,\lambda) \qquad (7)$$

This calibrated pupil image can be used to determine properties of a target structure, by reconstruction or other methods.

While four steps each using a half-moon aperture are described as an example, this is only an example. In principle, the ghost calibration should be possible with two half-moon apertures oriented at 180 degrees with respect to each other (orientations hm0 and hmπ, for example). In practice, in the imaging of the half-moon aperture at the back focal plane of the optical system, there are diffraction effects at the edges, so that good data for this boundary region cannot be synthesized. For this reason, it is proposed to use another set of two half-moon apertures oriented at 90 degrees to the first set of measurements (orientations hmπ/2 and hm3π/2, for example). Altogether, half-moon apertures in four different orientations rotated at 90 degrees with respect to each other provide ample overlap so that high quality data can be used for ghost calibration of the optical setup. In principle, the number of calibration steps could be 2, 3, 4 or any number.

The size of the dark portion of the illumination aperture could be greater or less than a half moon, provided that sufficient portions of the captured images over the full set of measurements are from portions not subject to total internal reflection of bright radiation from a part of the illumination profile. In the disclosed embodiments, the portion of the entrance pupil illuminated each time is a segment of the full pupil. The segment may be for example greater than a quadrant and less than or equal to approximately one half of the pupil. This will provide sufficiently overlapping segments to avoid using the boundary zone. One could for example use four captures each time with a segment sufficiently larger than a quadrant, but it does not have to be a half moon. Half-moon apertures may be convenient partly because they are available already within the aperture device 13 of existing scatterometers or other apparatus, and used in measurements of targets.

Returning to the example with four measurement steps using half-moon apertures, it may be desirable to use different orientations than the ones indicated in FIG. 7. For example, unwanted influence of the edge diffraction effects can be minimized in some embodiments by taking the four measurements at orientations rotated 45 degrees from those shown in FIGS. 7 and 8. (As mentioned above, the experimental image on which FIG. 8 is based was captured with an aperture rotated 45 degrees from that shown). The idea in this case is to exploit polarization and other effects, which cause some regions of the pupil image to be dark, or to be inherently subject to uncertainty when used in measurement. In such a case, by performing the calibration measurements with the half-moon aperture oriented at angles π/4, 3π/4, 5π/4 and 7/4π, the influence of the edge diffraction can be further minimized. In a case where only two calibration measurements are made, this 45 degree orientation can be particularly advantageous.

While the example steps above describe capturing the ghost image data with no target in the near field of the SIL 60, the desired result can also be obtained with a suitable target present. Provided the target generated only direct (specular) reflections, and does not scatter radiation back into the "dark" half of the pupil image, the calibration need not be affected. However, the calculation may need to be adapted, and knowledge of, for example, the gap between the SIL and the target structure, may need to be included.

Method for Objective Lens-SIL Transmission Calibration

In the hyper NA optical system with SIL 60, radiation through the illumination path IP is incident on the target T' through the entrance pupil of the objective lens 16 and the SIL. After an interaction with the target T', the radiation at back focal plane of the combined system (objective lens and SIL) is imaged at the detector 19.

Referring again to FIG. 9, assume for simplicity that the pupil symmetry point PSP has coordinates (0,0). When radiation is reflected at the SIL surface or by a target T' in the near field below the SIL, radiation incident at point P1=(x,y) in the entrance pupil has its specular reflection contribution at point P2=(-x, -y) in the back focal plane. The intensity detected at P2 is a function of optical transmission of the microscope objective and SIL for the chosen incident wavelength and polarization. Particularly with a SIL made of very high index material, typically greater than 2, transmission loss may be significant and requires taking into account for accurate calculation of the target properties by, e.g., reconstruction.

The mathematical description and the proposed procedure to account for the optical transmission of the objective and SIL is described below. The method assumes that the ghost image calibration is already performed, for example by the method just described with reference to FIGS. 7 and 8.

Raw pupil images are captured using detector 19 in the sensing part 902 and the reference part 906. In relation to a point P2, these images give intensity values $I_{sil,raw}^{sens,out}(P_2,t_1)$ $I_{sil}^{ref,out}(P_2,t_1)$, $I_{target}^{sens,out}(P_2,t_2)$, $I_{target}^{ref,out}(P_2,t_2)$. The values with subscript "sil" are from images captured with no target in the near field, while values with subscript "target" are captured when a target T' is in the near field. The target for the purposes of this section could be a real target or a fiducial target. In this approach, the SIL bottom surface is acting effectively as a fiducial. The reference pupil image is used to account for the intensity fluctuations in the target and SIL measurement. The notations used in the following equations are listed below:

$T_\alpha$: Transmission of the lens and SIL for a ray of illumination at angle α. (Angles in the lens correspond to positions in the pupil planes.) This calibration is performed for different polarization and wavelength configurations that may be used in a future measurement task, so that $T_\alpha = T_\alpha$(pol, λ).

$T_\beta$: Transmission of the optics in the collection path CP path of the scatterometer. Also, $T_\beta = T_\beta$(pol, λ).

$T_\gamma$: Transmission of the optics in the reference path RP of the scatterometer. Also, $T_\gamma = T_\gamma$(pol, A)

$R_{sil}$: Reflectivity of SIL at the glass-gas interface (surface 604). Also $R_{sil} = R_{sil}$(pol, λ, α).

$R_{rf}$: Reflectivity of a retro-reflector used in the reference path RP. Also, $R_{rf} = R_{rf}$(pol, λ, α)

$I_{dc}^s$: DC offset of the detector 19 in the pupil image region 902.

$I_{dc}^r$: DC offset of the detector 19 in the reference beam region 904.

$t_1$ and $t_2$: Duration of data acquisition.

k is a scaling factor for ghost subtraction from a raw image, due to different exposure time of data acquisition. i.e., $$k = \frac{t_r}{t_{gh}}$$

$I_{gh}^{tot}$: The ghost contribution in the pupil image region 902 and reference beam region 904 respectively, calibrated for DC and non-linearity offset. Also, $I_{gh}^{tot} = I_{gh}^{tot}$(pol, λ, α)

$I_{sil}^{in}$: Input intensity while performing a measurement after calibration $I_{sil}^{in} = I_{sil}^{in}$(pol, λ, t)

Now, when no target is in the near field the following relationship between the captured signal at point P2 and the incident illumination applies:

$$(I_{sil,raw}^{ref,out}(P_2,t_1) - I_{dc}^r)f_{nl} - kI_{gh}^{ref,tot} = I_{sil}^{in}(P_1,t_1)T_\gamma R_{rf} \quad (8)$$

Using a tilde ~ to signify a corrected pixel intensity, this can be written as:

$$\tilde{I}_{sil}^{ref,out}(P_2,t_1) = I_{sil}^{in}(P_1,t_1)T_\gamma R_{rf} \quad (9)$$

When a target is present, the raw captured signal is related to the illuminating radiation by the formula:

$$(I_{target,raw}^{sens,out}(P_2,t_2) - I_{dc}^s)f_{nl} - kI_{gh}^{sens,tot} = I_{target}^{in}(P_1,t_2)T_\alpha^2 T_\beta R_{target} \quad (10)$$

which can be written as:

$$\tilde{I}_{target}^{sens,out}(P_2,t_2) = I_{target}^{in}(P_1,t_2)T_\alpha^2 T_\beta R_{target} \quad (11)$$

and the raw captured reference signal is related to the illuminating radiation by the formula:

$$(I_{target,raw}^{ref,out}(P_2,t_2) - I_{dc}^r)f_{nl} - kI_{gh}^{ref,tot} = I_{target}^{in}(P_1,t_2)T_\gamma R_{rf} \quad (12)$$

which can be written as:

$$\tilde{I}_{target}^{ref,out}(P_2,t_2) = I_{target}^{in}(P_1,t_2)t_\gamma R_{rf} \quad (13)$$

The parameter of interest, for measuring a property of a target structure, is $R_{target}$, using the previous equations this parameter is given by:

$$R_{target} = \frac{\tilde{I}_{target}^{sens,out}(P_2, t_2)}{\tilde{I}_{sil}^{sens,out}(P_2, t_1)} R_{sil} \frac{I_{sil}^{in}(P_1, t_1)}{I_{target}^{in}(P_1, t_2)} \quad (14)$$

From Equations (9) and (13), we can write:

$$\frac{I_{sil}^{in}(P_1, t_1)}{I_{target}^{in}(P_1, t_2)} = \frac{\tilde{I}_{sil}^{ref,out}(P_2, t_1)}{\tilde{I}_{target}^{ref,out}(P_2, t_2)} \quad (15)$$

Substituting this into Equation (14) results in:

$$R_{target} = \frac{\tilde{I}_{target}^{sens,out}(P_2, t_2)}{\tilde{I}_{sil}^{sens,out}(P_2, t_1)} R_{sil} \frac{\tilde{I}_{sil}^{ref,out}(P_2, t_1)}{\tilde{I}_{target}^{ref,out}(P_2, t_2)} \quad (16)$$

Now, at the Brewster angle positions there is problem that the term $\tilde{I}_{sil}^{sens,out}(P_2,t_1)$, which is a denominator in the Equation 16, approaches zero. This makes existing calibration techniques ineffective at those positions.

This problem is solved by making a measurement with a known reference reflector (fiducial) in the near field. If the situation with this reference reflector, such as an aluminum reference, is indicated by subscript "al", then $$R_{target} = \frac{\tilde{I}_{target}^{sens,out}(P_2, t_2)}{\tilde{I}_{al}^{sens,out}(P_2, t_1; h)} R_{al}(h) \frac{\tilde{I}_{al}^{ref,out}(P_2, t_1)}{\tilde{I}_{target}^{ref,out}(P_2, t_2)} \quad (17)$$

Hence the calibration of transmission can be performed in near field with known fiducials (for example, Al) to overcome the low intensity Brewster angle regions in far field calibration of the transmission through the combined optical system (objective lens plus SIL). Another approach to this calibration in the far field would be to use data fitting in the pixels with low values of $\tilde{I}_{sil}^{sens,out}(P_2, t_1)$, effectively using the data either side of the Brewster angle regions in some suitable interpolation formula.

Based on the above theory and its difficulty in implementation, a two-step method is disclosed for calibration of transmission. The objective lens 16 is firstly characterized for the transmission on known fiducials for different incident polarizations (ξ: H and V). This first step may be the same as a calibration as discussed above without the SIL. The following terms and notation are defined:

$T_{mo}^{\xi}(x, y)$: Transmission of objective lens 16 at an angle of incidence α, for ξ polarized input, given at pixel coordinates (x, y) in the pupil plane. (The subscript "mo" stands for "microscope objective")

$T_{mo+sil}^{\xi}(x, y)$: Transmission of objective lens and SIL combined at an angle of incidence α, for polarized input, given at pixel co-ordinates (x, y) in the pupil plane.

$A_{sil}$: Absorption inside SIL. As the material is isotropic the absorption is independent of incident polarization.

$r_{sil}^{a/g}$: Spurious reflection from the SIL's hemispherical upper surface 602 at a gas/glass interface. It is assumed to be independent of incident polarization and identical for different locations on the curvature of the SIL.

$S_{sil}$: Scattering within the SIL volume. This parameter is assumed to be independent of incident polarization. Further, because the SIL is formed by a highly homogeneous medium, this scattering can be considered as a second order effect.

Now, the following relationships can be written:

$$T_{mo+sil}^{H}(x,y) = T_{mo}^{H}(x,y) - (A_{sil} + r_{sil}^{a/g} + S_{sil})$$

and, $$T_{mo+sil}^{V}(x,y) = T_{mo}^{V}(x,y) - (A_{sil} + r_{sil}^{a/g} + S_{sil})$$

The terms $T_{mo+sil}^{H}(x, y)$ and $T_{mo+sil}^{V}(x, y)$ are not defined at the angle of incidence corresponding to the Brewster angle (which is dictated by the SIL refractive index). It is possible to determine $T_{mo}^{\xi}(x, y)$ on a known fiducial and then compute the effect of the SIL $(A_{sil} + r_{sil}^{a/g} + S_{sil})$ from the known transmission of the combined objective lens and SIL system. Then the information of $(A_{sil} + r_{sil}^{a/g} + S_{sil})$ can be used to compute the transmission of the optical system at the pixels with zero intensity and in its vicinity.

Method for NA Scaling and Pupil Symmetry Point Calibration

As mentioned above it is also of interest to have a further method for calibration of the NA scaling and pupil symmetry point. The pupil symmetry point (PSP) is the pixel location corresponding to a zero angle ray, aligned with optical axis O. The scaling of angles to pixel positions is known as NA scaling. A representation of NA scaling is represented schematically in FIG. 9 by the dimension NAS. PSP and NAS are parameters of the optical system and the inspection apparatus that are desired to be calibrated and well-defined, to maximize accuracy in the reconstruction or other method of metrology or inspection.

The alternative method disclosed herein exploits the total internal reflection phenomenon, which has been discussed already as a feature of the hyper NA optical system with SIL 60. In the far field situation, when the distance between the SIL and the substrate is much greater than wavelength λ, the pupil image captured by detector 19 has distinctive concentric areas. These areas are shown for example in FIG. 6(c) and have a boundary 640 corresponding to NA=1. The width (e.g., diameter) of the outer boundary 642 represents the maximum NA of the hyper-NA optical system. These features can be recognized in the captured pupil images and used for NA scaling.

For example, from one or more captured pupil images, let N be the number of pixels corresponding to the diameter of the circle at NA=1, and let the number of pixels corresponding to the diameter of the circle at the maximum NA circle be given by Nmax. Then the NA of the optical system is given by: NA=Nmax/N. The pupil symmetry point can also be identified by finding the center of these circles.

Application Example

Figure 10:
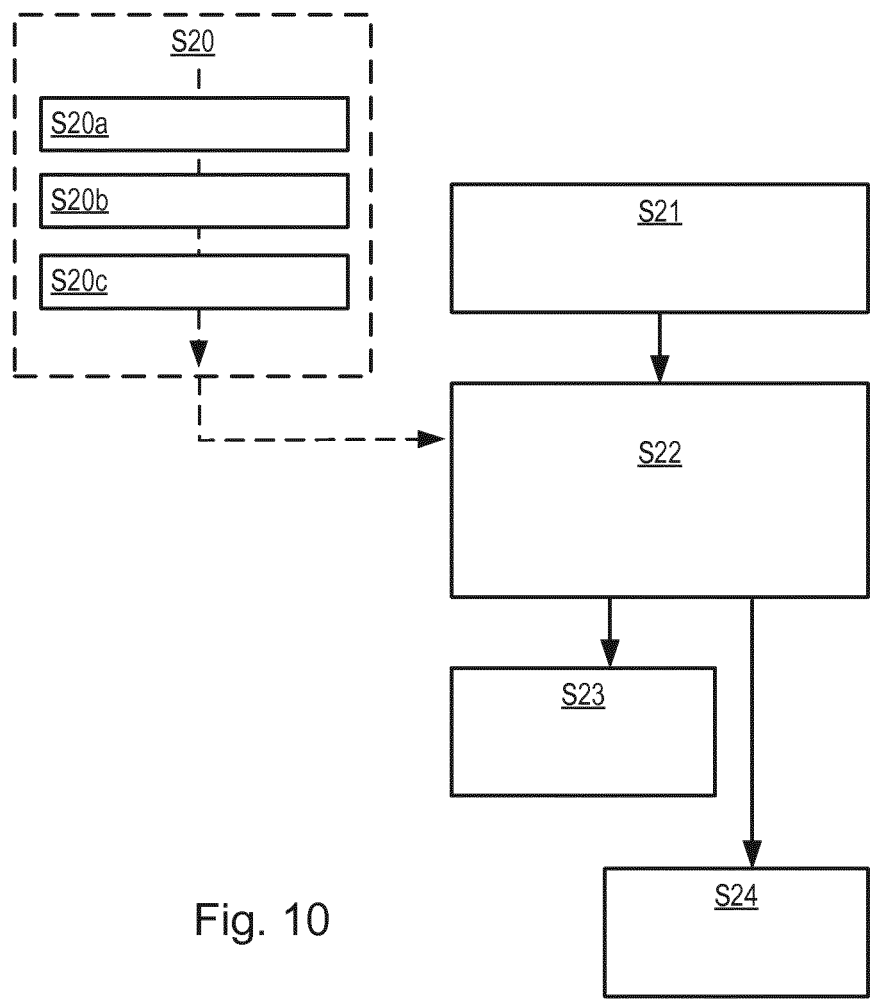
FIG. 10 is a flow chart of a calibration method applying various principles of the present disclosure.

FIG. 10 illustrates the application of a metrology apparatus whose optical system is calibrated by the techniques disclosed herein, in the control of a lithographic manufacturing system of the type illustrated in FIGS. 1 and 2. The steps will be listed here, and then explained in more detail:

S20: Calibration of optical system
S21: Process substrate to produce structures on substrate
S22: Measure CD and/or other parameter across substrate
S23: Update metrology recipe
S24: Update lithography and/or process recipe At step S20, calibration steps are performed in a scatterometer serving as metrology apparatus 240. The optical system of the scatterometer may include a SIL or micro-SIL. These calibrations can include any or all of the calibration steps disclosed herein, as well as any number of other calibration steps unrelated to the present disclosure. The calibration step S20 in this case includes: S20a ghost image calibration as described above; and/or S20b lens-SIL transmission calibration as described above; and/or S20c NA scaling and pupil symmetry point calibration, as described above.

The separate labeling and discussion of the calibrations of step S20 being performed in advance of an actual measurement is convenient for understanding, but this is not essential. The calibration steps can in principle be performed before or after or interleaved with the measurements on the target. Of course, any of the calibration steps can be repeated after a period of time, to update the corrections and maintain accuracy. Any or all of these calibration steps can be performed occasionally, or as part of every measurement cycle. The timing of the calibration operations will be designed to make them responsive to any drifts or changes in conditions within the apparatus, while minimizing as far as possible the calibration "overhead" that detracts from the throughput of real measurements.

At step S21, structures are produced across a substrate using the lithographic manufacturing system. At S22, the metrology apparatus 240 and optionally other metrology apparatus and information sources are used to measure a property of the structures across the substrate. For example, these measurements of the property are calculated from pupil images obtained via the scatterometer. A property of interest may be CD (critical dimension), OVL (overlay) and/or EPE (edge placement error) for example. Corrections obtained from the calibration step S20 are used in calculation of measurements at step S22. At step S23, optionally, one or more metrology recipes and/or calibrations of the metrology apparatus are updated in light of the measurement results obtained.

At step S24, measurements of CD or other parameters are compared with desired values, and used to update one or more settings of the lithographic apparatus and/or other apparatus within the lithographic manufacturing system. By providing a metrology apparatus with a better calibration, more accurate measurements can be obtained. This in turn can lead to better performance when the results of measurements are applied in further measurements and in further control of the lithographic apparatus.

Contaminant Detection

In the above examples, a solid immersion lens has been used to perform measurements. As described above, in an embodiment, the SIL is position to within approximately 20 nm of the surface to be measured in order to perform the measurements. In order to be able to position the SIL at this distance to the surface, the surface should be free of any contaminants (e.g. dust particles) on the surface of the substrate or target structure. In the following, reference will be made to a surface or surface under measurement. It will of course be appreciated that this term may refer equally well to a substrate surface or a target structure on a substrate.

During measurements, the SIL is positioned close to a surface under measurement. On conclusion of a particular measurement or series of measurements at a particular measurement location, the SIL is moved away from the surface (typically along the Z-axis) before there is relative displacement between the SIL and the surface in a direction parallel to the surface towards a next measurement target (along the X-Y axes). At the next measurement target, there is relative movement between the SIL and the surface along the Z-axis into a measurement position. It will be appreciated that, if one or more surface contaminants are present on the surface under measurement it is possible that there may be impact between the SIL and the contaminants during the movement. This may cause damage to one or both of the SIL or the surface under measurement.

Accordingly, it would be advantageous to assess a surface under measurement for contaminants before the SIL is located in the measurement position. It would additionally be advantageous to perform the assessment before the SIL is located close enough for the contaminant to come into contact with the SIL before the relative movement between the SIL and the surface can be arrested. In particular, it would be advantageous to detect contaminants that are larger than the measurement gap.

Furthermore, detection of surface contaminants should be performed with a minimal impact on the measurement process. In other words, the measurement throughput of the measurement system should not be impacted by the detection process.

Figure 11:
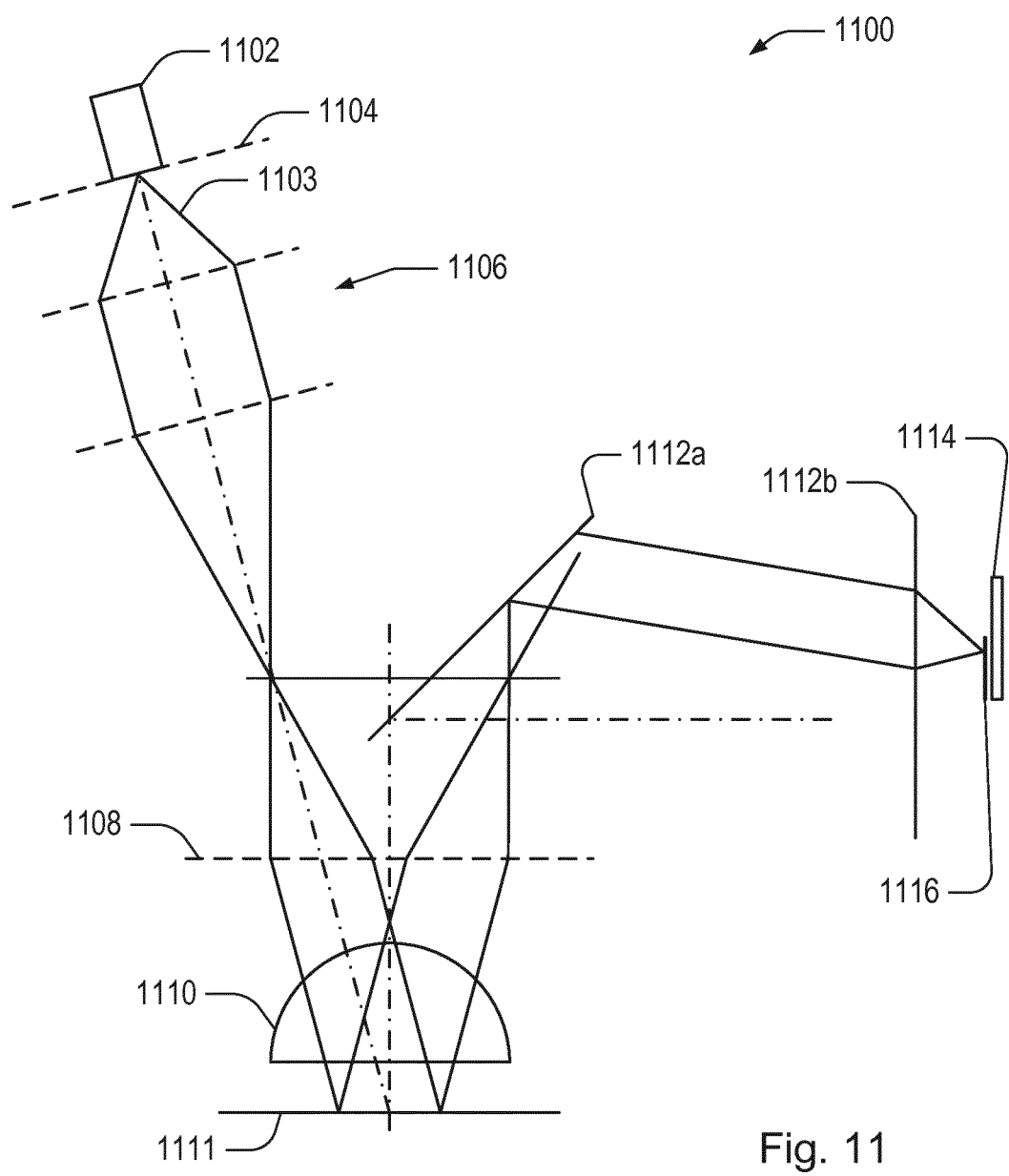
FIG. 11 illustrates a detection system according to an embodiment of the present disclosure.

An exemplary contaminant detection system 1100 is shown in FIG. 11. The contaminant detection system is shown in isolation for exemplary purposes only. In some examples, the contaminant detection system is integrated into the optical system of an inspection apparatus as described in the above examples. In such examples, one or more of the optical elements of the contaminant detection system may be shared with the optical system of the inspection apparatus. In other examples, the contaminant detection system is placed in a stand-alone apparatus.

The contaminant detection system comprises a radiation source 1102 that emits radiation 1103. The radiation source may be considered to be a point source input at a plane 1104. In an example, the radiation source is a laser source. In some examples, the characteristics of the radiation are chosen in dependence on the material or materials of the substrate. In other examples, the characteristics of the radiation are chosen in dependence on the material properties of expected contaminants to be detected.

The radiation propagates through a contaminant illumination system 1106, which may comprise one or more optical elements, and through an objective lens 1108 and a SIL 1110 to provide contaminant detection illumination to a surface 1111 under measurement. The contaminant detection illumination forms a spot on the surface under measurement, and is scattered by the surface. The radiation source and contaminant illumination system may be used to form any suitable illumination for detecting contaminant. In some examples, the contaminant detection illumination is delivered to the surface under measurement at a particular angle. In a specific example, the illumination is formed as off-axis Köhler illumination.

The objective lens may have any suitable shape, and may in some examples be identical to an objective lens as described with reference to FIG. 5 above. Similarly, the SIL may have any suitable set of properties. In an example, the objective lens and the SIL of the contaminant illumination system are shared with the optical system discussed above.

The scattered detection radiation propagates back through the SIL and the objective lens. Subsequently, the scattered detection radiation passes through a detection radiation collection system 1112a, 1112b and arrives at a detector 1114. The detection radiation collection system may take any suitable shape and may comprise any suitable optical components. In an example, the detection collection radiation system as described in the preceding examples. Similarly, the detector may be identical to the detector described with reference to the preceding examples. In some examples, the detector comprises a blocking aperture element 1116. The blocking aperture element may in some examples be formed so as to block specularly reflected radiation. It will of course be appreciated that the function of the blocking aperture element could, in principle, be implemented in alternative ways (e.g. a detector filter, or a software filtering algorithm).

Figure 12:
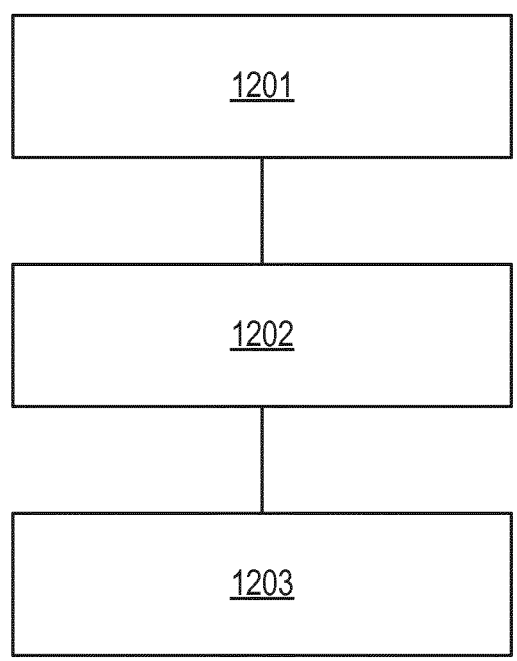
FIG. 12 is a flow chart illustrating a method of controlling performance of a metrology method and/or of a lithographic manufacturing process using measurements made by the detection system of FIG. 11.

As described above, at least part of the optical system of the inspection apparatus is moved within a particular proximity of a given surface before measurement commences (the proximity is typically tens or hundreds of nm). In some examples, the method of deriving a correction for an optical system comprises moving at least part of the optical system prior to the obtaining steps. An exemplary moving step will now be discussed with reference to FIG. 12.

At 1201, a surface is illuminated with detecting radiation. The illumination step may be carried out in any suitable fashion. In an example, the surface is illuminated by using a system such as described with reference to FIG. 11.

At 1202, detection radiation scattered by the surface is received. In some examples, the receiving comprises: receiving an intensity profile representing scattered detection radiation collected by the detection radiation collection system; and using the received intensity profile to determine the presence of a contaminant on the surface. In an example, the scattered detection radiation is collected by a system such as described with reference to FIG. 11.

At 1203, a movement within the optical system (e.g. a relative movement between the SIL and the surface to be measured) is controlled based on the received scattered detection radiation. In an example, if a surface contaminant is detected during the receiving step, a suitable control action is taken. In a specific example, the movement of at least part of the optical system (e.g., movement of the SIL relative to the surface to be measured) is controlled.

The optical system may, as will be appreciated, be controlled in any suitable fashion. In some examples, the movement is stopped if a surface contaminant is detected. In other examples, the movement speed is reduced but not stopped. In an example, the optical system is moved into an initial position. In another example, movement of the optical system is stopped and a specific distance between the optical system and the measurement surface is maintained. It will be appreciated that the above-mentioned examples may comprise movement along one or several movement axes. It will further be appreciated that additional or alternative actuators within the optical system may be actuated as part of the control action.

Figure 13:
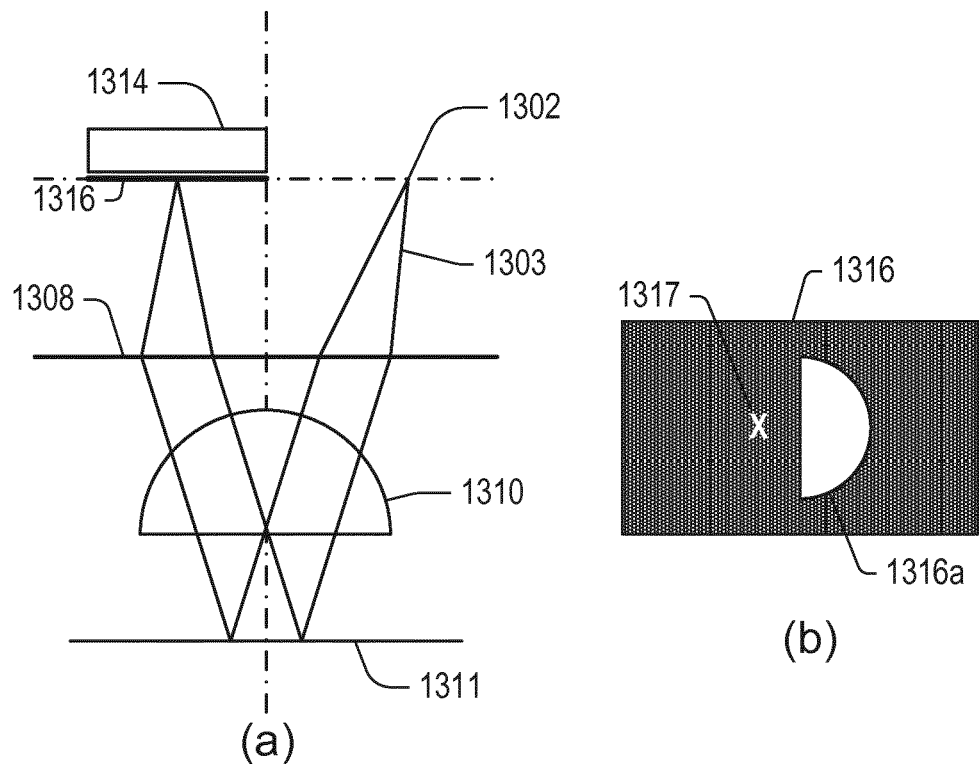
FIG. 13(a) illustrates a detection system according to another embodiment of the present disclosure.
FIG. 13(b) illustrates an aperture according to an embodiment, the aperture being part of the detection system as illustrated by FIG. 13(a)
Figure 14:
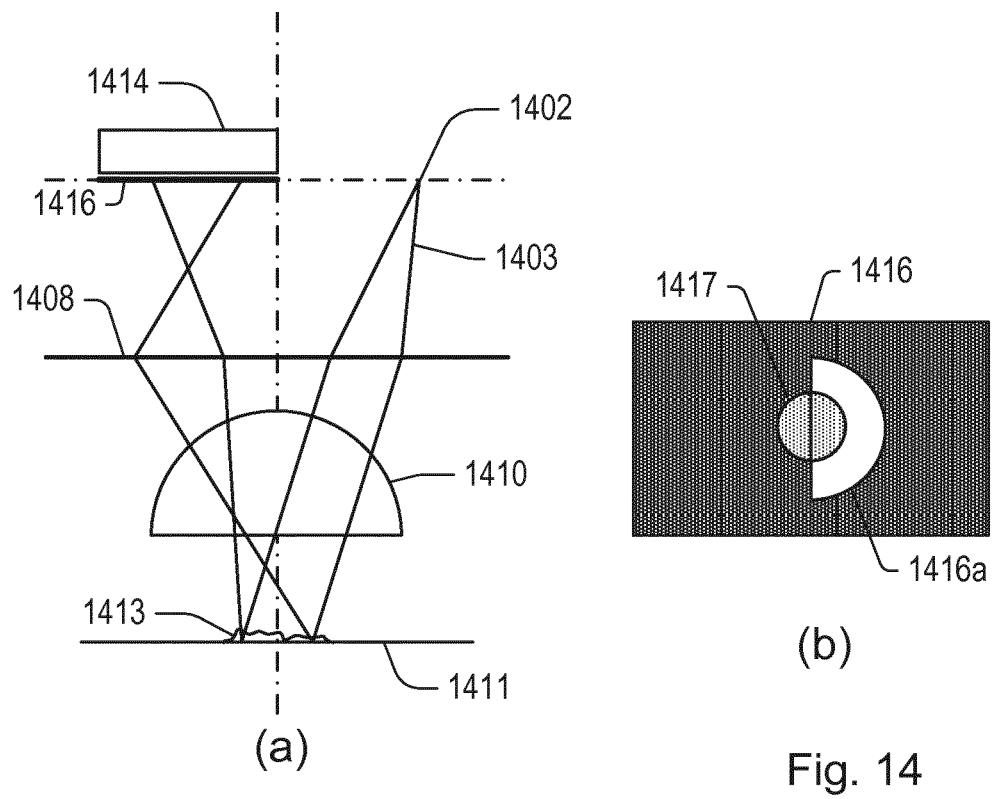
FIG. 14(a) illustrates the detection system according to FIG. 13(a), including a contaminated substrate.
FIG. 14(b) illustrates the relative position of scattered radiation with respect to the aperture of FIG. 13(b)

An exemplary apparatus in particular measurement situations will now be described with reference to FIGS. 13 and 14. For ease of comparison with FIG. 11, elements of FIGS. 13 and 14 and similar to corresponding elements of FIG. 11 are labelled with reference signs similar to those used in FIG. 11, but with prefixes "13" and "14" respectively instead of "11".

FIG. 13(a) shows an exemplary apparatus substantially identical to that shown in FIG. 11. In this example, a radiation beam 1303 is emitted by a radiation source 1302 to be scattered by the surface 1311. The radiation propagates through an objective lens 1308 and a SIL 1310, and onto the surface. If no contaminants are present, the predominant scattering mechanism is specular reflection from the surface. The specularly reflected radiation propagates back through the SIL and through a detection optical system (not shown). The reflected radiation arrives at a detector 1314. In an example, the detector comprises a blocking aperture element 1316.

FIG. 13(b) shows an exemplary blocking aperture element 1316. The blocking aperture element has a half-moon aperture 1316a. The specularly reflected radiation is blocked by the blocking aperture element (the position of the specularly reflected radiation spot is indicated by the X 1317 in FIG. 13(b)). Accordingly, the detector does not receive any of the specularly reflected radiation.

FIG. 14(a) shows a second exemplary situation, in which a contaminant is present on the surface.

In this example, the radiation beam 1403 is, at least partially, scattered by a surface contaminant 1413. The angular spread of the scattered radiation will be larger than that of the specularly reflected radiation in FIG. 13. Accordingly, the scattered radiation will form an intensity distribution at the detection plane, rather than the reflected spot of FIG. 13. The radiation distribution at least partly overlaps the aperture on the blocking aperture element, i.e. at least a portion of the scattered radiation will pass through the aperture 1416a. As a result, the detector receives radiation scattered from the substrate, and the presence of a surface contaminant will be indicated by a non-zero signal from the detector.

Any suitable detector may be used. In some examples, one or more photo diodes are used. In practice it is beneficial to use a detector with a short integration time. When used with a high-brightness radiation source (e.g. a laser), it is possible to perform rapid detection of contaminants residing on a substrate. A processing unit (not shown) may be provided to perform one or more further operations subsequent to the measurements. Such operations may in some examples be based on measurement data.

In the above example, the optical system comprises an aperture to provide attenuation of the specularly reflected radiation. However, it will be appreciated that alternatives to an aperture may, in principle, equally well be used. In one example, the location of the detector may be shifted such that the specularly reflected radiation does not arrive at the detector. In another example, an attenuating coating is applied to part of the detector surface.

A further exemplary apparatus will now be described with reference to FIG. 15. For ease of comparison with FIG. 13, elements of FIG. 15 and similar to corresponding elements of FIG. 13 are labelled with reference signs similar to those used in FIG. 13, but with prefix "15" instead of "13". Furthermore, for conciseness, only elements that differ substantially from those of preceding examples will be discussed in detail in the following.

Figure 15:
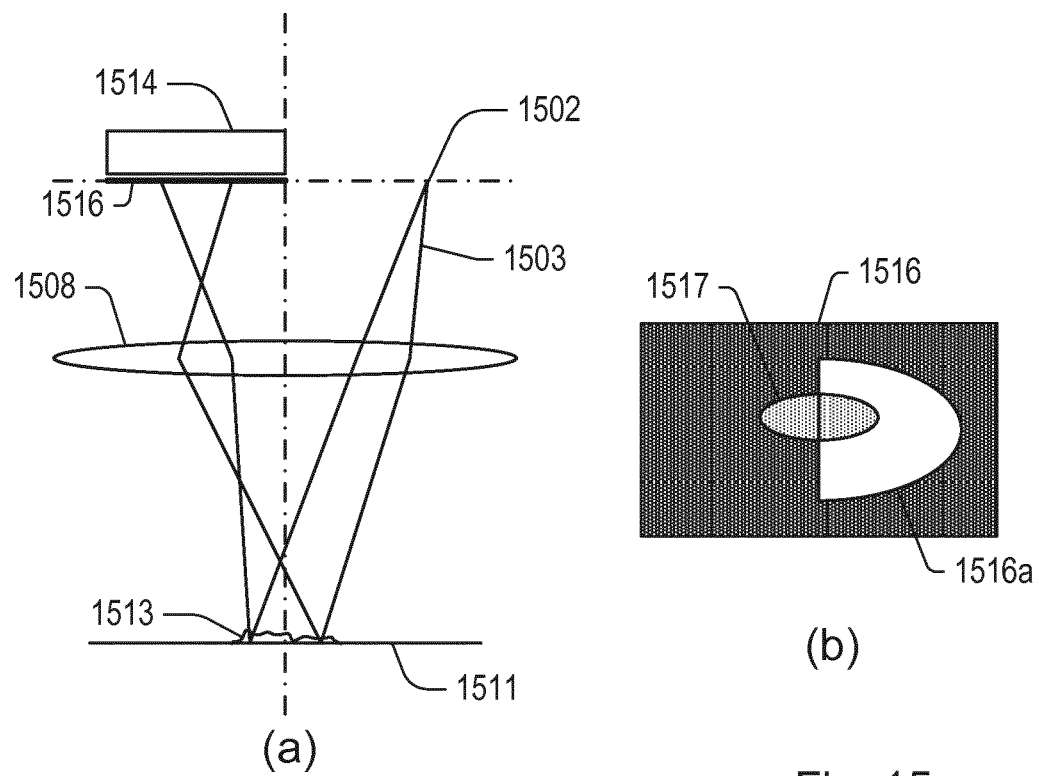
FIG. 15(a) illustrates a detection system according to another embodiment of the present disclosure.
FIG. 15(b) illustrates an aperture according to another embodiment, the aperture being part of the detection system of FIG. 15(a)

The exemplary apparatus shown in FIG. 15 does not comprise a SIL. Rather, the optical system comprises an objective lens 1508. The objective lens acts as a Fourier transform element on the radiation.

When no contaminants are present on the surface, the specularly reflected radiation will be blocked by a blocking aperture element. If a contaminant is present on the surface, the radiation is diffracted so as to cause it to no longer be completely blocked by the blocking aperture element.

Under certain circumstances, particle detection may be difficult, particularly if the defect size is only on the order of tens of nanometers. Particle detection may also be difficult if the refractive index of the particles is similar to that of the substrate or other surface below (e.g. glass particles on a substrate surface).

Figure 16:
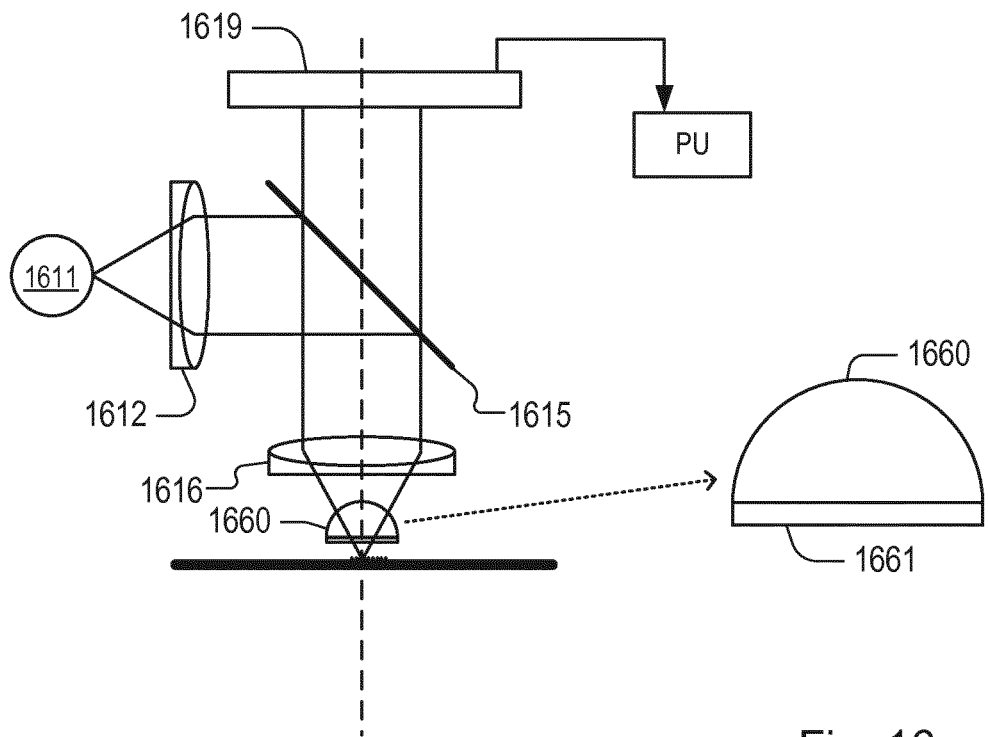
FIG. 16 illustrates a detection system comprising a solid immersion lens provided with a dielectric coating.

FIG. 16 illustrates an exemplary optical system comprising a SIL. In the present example, the optical system is a scatterometer substantially identical to that shown in FIG. 5. However, it will be appreciated that this is for illustrative purposes only, and that, in reality, the following example may be implemented in a system such as shown in FIG. 11. It will additionally be appreciated that many embodiments may be envisaged. For ease of comparison with FIG. 5, elements of FIG. 16 and similar to corresponding elements of FIG. 5 are labelled with reference signs similar to those used in FIG. 5, but with prefix "16". Furthermore, for conciseness, only elements that differ substantially from those of preceding examples will be discussed in detail in the following.

The scatterometer comprises a radiation input (e.g. radiation source) 1611, an illumination system 1612, a partially reflecting surface 1615, an objective lens 1616 and a detector 1619. Similarly to the scatterometers of FIG. 5, the scatterometers comprises a SIL 1660. A deposition 1661 is applied to a surface of the SIL.

The deposition is operable to enhance evanescent wave interaction between the SIL and a contaminant on the surface. This increases the signal-to-noise ratio of the particle detection system. Contaminant detection may be performed in any suitable fashion, and is in some examples performed as substantially described above. In a particular example, differential detection, as described above, is used to detect the presence of contaminants on the surface.

Any suitable deposition may be applied. In some examples, the deposition is a dielectric coating. The dielectric coating may be comprised of one or a plurality of layers of dielectric material. The dielectric coating may comprise any suitable or plurality of suitable materials. In an example, the dielectric coating is matched to at least one physical property of a substrate. In an example, the dielectric coating is matched to a refractive index of the substrate.

The dielectric coating may, in some examples, have any suitable one or more further characteristics. In an example, the dielectric coating comprises a wavelength dependent material (e.g. a dielectric material wherein one or more optical characteristics, such as wavelength-dependent response, are dependent on the thickness of the material). In other examples, one or more of the dielectric materials are polarization-sensitive. In other words, an optical property of the dielectric material(s) depends on the polarization of the radiation.

CONCLUSION

The calibration methods disclosed herein can be used in cases where conventional methods cannot be applied, or give less accurate results. Although specific reference may be made in this disclosure to the use of calibration methods and apparatuses in inspection apparatuses such as a scatterometer, it should be understood that the disclosed arrangements may have application in other inspection apparatuses, such as microscopes, and in other types of functional apparatuses, as mentioned already above. The embodiments described herein are not limited in application to any particular type of inspection apparatus, or even to inspection apparatuses generally.

Although the methods disclosed here been conceived specifically to address issues arising in optical systems with SIL or micro-SIL, the ghost image correction method disclosed herein can be applied in optical systems without a SIL also. Using illumination profiles such as the half-moon profiles allows, for example, calibration of ghost images without the need for a beam dump.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively.

Further embodiments are disclosed in the list of numbered clauses below:

1. A method of deriving a correction for an optical system, the optical system being operable for both delivering illuminating radiation to a target structure and collecting radiation after interaction with the target structure, the method comprising:

obtaining a first intensity profile representing radiation collected by the optical system while illuminating a pupil of the optical system in accordance with a first illumination profile;

obtaining a second intensity profile representing radiation collected by the optical system while illuminating the pupil of the optical system in accordance with a second illumination profile different from the first illumination profile; and using the first and second intensity profiles to derive a correction for mitigating the effect of interaction of the illuminating radiation with the optical system, as opposed to interaction with a target structure.

2. The method of clause 1, wherein the using the first and second intensity profiles to derive the correction uses different portions of the first and second intensity profiles to synthesize an intensity profile representing the effect of interaction of the illuminating radiation with the optical system.

3. The method of clause 1 or clause 2, wherein each of the first and second intensity profiles represents a distribution of radiation in a back focal plane of the optical system and wherein the using the first and second intensity profiles to derive the correction uses portions of the first and second intensity profiles corresponding to different regions of the back focal plane.

4. The method of any of clauses 1 to 3, wherein a further intensity profile is obtained representing radiation collected by the optical system while illuminating the pupil of the optical system in accordance with a further illumination profile different from the first and second illumination profiles, the using the first and second intensity profiles to derive the correction using the first, second and further intensity profiles to derive the correction.

5. The method of any preceding clause, wherein the optical system includes a solid immersion lens and a mounting operable to hold the solid immersion lens within a distance from the target structure that is less than a wavelength of the illuminating radiation.

6. The method of clause 5, wherein the first and second illumination profiles represent radiation collected with no target structure within the distance.

7. The method of any preceding clause, further comprising:

obtaining a third intensity profile representing radiation collected by the optical system after interaction with the optical system and a reference structure; and using the third intensity profile to derive a further correction.

8. The method of clause 7, further wherein the optical system includes a solid immersion lens and a mounting operable to hold the solid immersion lens within a distance from the target structure that is less than a wavelength of the illuminating radiation, and further comprising obtaining a fourth intensity profile representing radiation collected by the optical system after interaction with the optical system and the reference structure without the SIL present, and using both the third and fourth intensity profiles to derive the further correction.

9. The method of clause 7 or clause 8, further comprising obtaining a reference intensity profile representing characteristics of the illuminating radiation prior to interaction with the optical system and target structure, wherein using the third intensity profile to derive a further correction uses the reference intensity profile to derive the further correction.

10. The method of any preceding clause, wherein deriving the correction includes corrections for characteristics of a detector used to obtain the intensity profiles.

11. The method of any preceding clause, wherein in each of the first and second illumination profiles a portion of the pupil is illuminated that is less than or equal to approximately one half of the pupil, while a remaining portion of the pupil is substantially dark, the illuminated portions and dark portions being different between the first and second illumination profiles.

12. The method of any preceding clause, wherein in each of the first and second illumination profiles a portion of the pupil is illuminated each time which is a segment greater than a quadrant and less than or equal to approximately one half of the pupil.

13. The method of any preceding clause, wherein the optical system is operable to deliver illuminating radiation of different selectable characteristics and wherein the method is performed two or more times with different first and second intensity profiles, to derive corrections applicable to radiation collected under different selectable characteristics.

14. A method of determining a property of a structure, the method comprising deriving a correction by the method of any preceding clause and further comprising:

receiving a measurement intensity profile representing radiation collected by the optical system after interaction with the structure; and calculating a measurement of the property of the structure based at least partly on the measurement intensity profile, and using the derived correction.

15. A method of controlling a relative movement between an optical system and a measurement surface, the optical system being operable to both deliver illuminating radiation to the measurement surface and collect radiation after interaction with the measurement surface, the method comprising:

illuminating the measurement surface with detection radiation;

receiving detection radiation scattered by the measurement surface; and controlling the relative movement based on the received scattered detection radiation.

16. The method of clause 15, wherein the illuminating is performed using a contaminant illuminating optical system.

17. The method of clause 15 or clause 16, wherein the receiving is performed using a detection radiation collection system.

18. The method of clause 17, wherein the receiving comprises:

receiving an intensity profile representing scattered detection radiation collected by the detection radiation collection system; and using the received intensity profile to determine the presence of a contaminant on the surface.

19. The method of any of clauses 15 to 18, wherein the controlling the relative movement comprises at least one selected from: stopping movement of at least one part of the optical system; reducing movement speed of at least one part of the optical system; moving at least one part of the optical system into an initial position; or maintaining a specific distance between the optical system and the measurement surface.

20. An apparatus configured to deriving a correction for an optical system, the optical system being operable for both delivering illuminating radiation to a target structure and collecting radiation after interaction with the target structure, the apparatus comprising a processor configured to:

receive a first intensity profile representing radiation collected by the optical system while illuminating a pupil of the optical system in accordance with a first illumination profile;

receive a second intensity profile representing radiation collected by the optical system while illuminating the pupil of the optical system in accordance with a second illumination profile different from the first illumination profile; and derive using the first and second intensity profiles a correction for mitigating the effect of interaction of the illuminating radiation with the optical system, as opposed to interaction with a target structure.

21. The apparatus of clause 20, wherein the processor is configured to use different portions of the first and second intensity profiles to synthesize an intensity profile representing the effect of interaction of the illuminating radiation with the optical system.

22. The apparatus of clause 20 or clause 21, wherein each of the first and second intensity profiles represents a distribution of radiation in a back focal plane of the optical system and wherein the processor is configured to use portions of the first and second intensity profiles corresponding to different regions of the back focal plane.

23. The apparatus of any of clauses 20 to 22, wherein the processor is configured to receive a further intensity profile representing radiation collected by the optical system while illuminating the pupil of the optical system in accordance with a further illumination profile different from the first and second illumination profiles, and wherein the processor is configured to use the first, second and further intensity profiles to derive the correction.

24. The apparatus of any of clauses 20 to 23, wherein the processor is further configured to:

receive a third intensity profile representing radiation collected by the optical system after interaction with the optical system and a reference structure; and derive a further correction using the third intensity profile.

25. The apparatus of clause 24, wherein the processor is further configured to:

receive a fourth intensity profile representing radiation collected by the optical system after interaction with the optical system and the reference structure, the fourth intensity profile representing radiation collected with a solid immersion lens SIL present in the optical system and the fourth intensity profile representing radiation collected by the optical system without the solid immersion lens; and derive the further correction using both the third and fourth intensity profiles.

26. The apparatus of clause 25, wherein the processor is further configured to:

receive a reference intensity profile representing characteristics of the illuminating radiation prior to interaction with the optical system and target structure; and derive the further correction using the reference intensity profile in addition to the third and fourth intensity profiles.

27. The apparatus of any of clauses 20 to 26, wherein the processor is configured to derive the correction so as to include a correction for characteristics of a detector used to obtain the intensity profiles.

28. The apparatus of any of clauses 20 to 27, wherein the processor is further configured to:

receive a measurement intensity profile representing radiation collected by the optical system after interaction with a structure of interest; and calculate a measurement of a property of the structure based at least partly on the measurement intensity profile, and using the derived correction.

29. An apparatus configured to perform a method of controlling a movement of an optical system with respect to a measurement surface according to any of clauses 15 to 19.

30. The apparatus of clause 29, comprising a contaminant detection system, the contaminant detection system comprising:

a contaminant illumination system arranged to provide contaminant detection illumination to a surface of interest; and a detection radiation collection system arranged to collect contaminant detection illumination scattered by the surface of interest.

31. The apparatus of clause 30, wherein the detection radiation collection system comprises a specular radiation filtering component.

32. The apparatus of clause 31, wherein the specular radiation filtering component is selected from: an aperture operable to block specular radiation, or a detector operable to only detect non-specular radiation.

33. The apparatus of any of clauses 20 to 32, wherein at least one of the optical system or the contaminant detection system comprises at least one optical element provided with a dielectric coating configured to enhance an evanescent wave interaction between the optical element and a structure or surface of interest.

34. An optical system for inspection of a surface, the optical system configured to deliver illuminating radiation to the surface and collect radiation after interaction with the surface, the optical system comprising at least one optical element provided with a dielectric coating configured to enhance an evanescent wave interaction between the optical element and the surface.

35. The optical system of clause 34, wherein the optical element is a solid immersion lens.

36. The optical system of clause 34 or clause 35, wherein the dielectric coating comprises a plurality of layers of dielectric material.

37. The optical system of any of clauses 34 to 36, wherein the dielectric coating matches at least one physical property of a structure or surface of interest.

38. An inspection apparatus comprising an optical system, a control system for the optical system and the apparatus of clause 28, the control system being configured to control the optical system to obtain the first and second intensity profiles, to obtain the measurement intensity profile from the structure of interest and, if applicable, to obtain the further intensity profile and the third and fourth intensity profiles and to deliver the intensity profiles to the processor for use in deriving the correction and calculating a property of the structure of interest.

39. The inspection apparatus of clause 38, wherein the control system is further configured to control the optical system to obtain the further intensity profile representing radiation collected by the optical system, while illuminating the pupil of the optical system in accordance with a further illumination profile different from the first and second illumination profiles, and to deliver the first, second and further intensity profiles to the processor for use in deriving the correction.

40. The inspection apparatus of clause 38 or clause 39, wherein the control system is further configured to control the optical system to obtain the third intensity profile representing radiation collected by the optical system after interaction with the optical system and a reference structure, and to deliver the third intensity profile to the processor for use in deriving a further correction.

41. The inspection apparatus of any of clauses 38 to 40, wherein the optical system includes a solid immersion lens and a mounting operable to hold the solid immersion lens within a distance from a target structure that is less than a wavelength of the illuminating radiation.

42. The inspection apparatus of clause 40, wherein the optical system includes a solid immersion lens and a mounting operable to hold the solid immersion lens within a distance from a target structure that is less than a wavelength of the illuminating radiation, and wherein the control system is further configured to obtain the fourth intensity profile representing radiation collected by the optical system after interaction with the optical system and the reference structure without the SIL present, and to use both the third and fourth intensity profiles to derive a further correction.

43. The inspection apparatus of clause 42, wherein the control system is further configured to control the optical system to obtain a reference intensity profile representing characteristics of the illuminating radiation prior to interaction with the optical system and target structure, and wherein the processor is configured to use the reference intensity profile to derive the further correction.

44. The inspection apparatus of any of clauses 38 to 43, wherein the control system is configured to control the optical system to obtain the first and second illumination profiles by collecting radiation with no target structure within the distance.

45. The inspection apparatus of any of clauses 38 to 44, wherein the optical system is controlled to generate each of the first and second illumination profiles such that a portion of the pupil is illuminated that is less than or equal to approximately one half of the pupil, while a remaining portion of the pupil is substantially dark, the illuminated portions and dark portions being different between the first and second illumination profiles.

46. The inspection apparatus of any of clauses 38 to 45, wherein the optical system is controlled to generate each of the first and second illumination profiles such that a portion of the pupil is illuminated each time, the portion being a segment greater than a quadrant and less than or equal to approximately one half of the pupil.

47. The inspection apparatus of any of clauses 38 to 46, wherein the optical system is operable to deliver illuminating radiation of different selectable characteristics and wherein the control system is configured to control the optical system two or more times to obtain different first and second intensity profiles, to derive corrections applicable to radiation collected under different selectable characteristics.

48. The inspection apparatus of any of clauses 38 to 47, adapted for inspection of a microscopic structure formed on a semiconductor substrate.

49. The inspection apparatus of any of clauses 38 to 48, further comprising a contaminant detection system arranged to detect contaminants on a surface of interest.

50. The inspection apparatus of clause 49, wherein the contaminant detection system comprises:
 a contaminant illumination system arranged to provide contaminant detection illumination to a surface of interest; and
 a detection radiation collection system arranged to collect contaminant detection illumination scattered by the surface of interest.

51. The inspection apparatus of any of clauses 38 to 50, wherein at least one of the optical system or the contaminant detection system comprises at least one optical element provided with a dielectric coating configured to enhance an evanescent wave interaction between the optical element and a structure or surface of interest.

52. The inspection apparatus of clause 51, wherein the optical element is a solid immersion lens.

53. The apparatus of clause 51 or clause 52, wherein the dielectric coating comprises a plurality of layers of dielectric material.

54. The apparatus of any of clauses 51 to 53, wherein the dielectric coating matches at least one physical property of a structure or surface of interest.

55. A computer program product containing one or more sequences of machine-readable instructions for causing a processing system to perform the method of any of clauses 1 to 19 or to implement the processor of any of clauses 20-33.

56. A method of manufacturing devices including a lithographic process step, wherein, before or after performing the lithographic process step, measurements of structures on a substrate are obtained by the method of any of clauses 1 to 19, and wherein the obtained measurements are used to adjust parameters of the lithographic process step for the processing of the substrate and/or further substrates.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments have been described above, it will be appreciated that the invention may be practiced otherwise than as described. Furthermore, parts of the apparatus may be implemented in the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of deriving a correction for an optical system, the optical system being operable for both delivering illuminating radiation to a target structure and collecting radiation after interaction with the target structure, the method comprising:
    obtaining a first intensity profile representing radiation collected by the optical system while illuminating a pupil of the optical system in accordance with a first illumination profile;
    obtaining a second intensity profile representing radiation collected by the optical system while illuminating the pupil of the optical system in accordance with a second illumination profile different from the first illumination profile, each of the first and second intensity profiles representing a distribution of a plurality of radiation characteristic values on at least a first side of a middle of the respective intensity profile and a distribution of a plurality of radiation characteristic values on at least a second side of the middle of the respective intensity profile; and
    using at least two values from each of the at least first and second sides of a middle of the respective intensity profile of each of the first and second intensity profiles to derive a correction for mitigating the effect of interaction of the illuminating radiation with the optical system, as opposed to interaction with a target structure.

2. The method of claim 1, wherein the using the first and second intensity profiles to derive the correction uses different portions of the first and second intensity profiles to synthesize an intensity profile representing the effect of interaction of the illuminating radiation with the optical system.

3. The method of claim 1, wherein each of the first and second intensity profiles represents a distribution of radiation in a back focal plane of the optical system and wherein the using the first and second intensity profiles to derive the correction uses portions of the first and second intensity profiles corresponding to different regions of the back focal plane.

4. The method of claim 1, wherein a further intensity profile is obtained representing radiation collected by the optical system while illuminating the pupil of the optical system in accordance with a further illumination profile different from the first and second illumination profiles, and the using the first and second intensity profiles to derive the correction uses the first, second and further intensity profiles to derive the correction.

5. The method of claim 1, wherein the optical system includes a solid immersion lens and a mounting operable to hold the solid immersion lens within a distance from the target structure that is less than a wavelength of the illuminating radiation.

6. The method of claim 5, wherein the first and second illumination profiles represent radiation collected with no target structure within the distance.

7. The method of claim 1, further comprising:
    obtaining a third intensity profile representing radiation collected by the optical system after interaction with the optical system and a reference structure; and
    using the third intensity profile to derive a further correction.

8. The method of claim 7, wherein the optical system includes a solid immersion lens and a mounting operable to hold the solid immersion lens within a distance from the target structure that is less than a wavelength of the illuminating radiation, and further comprising obtaining a fourth intensity profile representing radiation collected by the optical system after interaction with the optical system and the reference structure without the solid immersion lens present, and using both the third and fourth intensity profiles to derive the further correction.

9. The method of claim 7, further comprising obtaining a reference intensity profile representing characteristics of the illuminating radiation prior to interaction with the optical system and target structure, wherein using the third intensity profile to derive a further correction uses the reference intensity profile to derive the further correction.

10. The method of claim 1, wherein in each of the first and second illumination profiles a portion of the pupil is illuminated that is less than or equal to approximately one half of the pupil, while a remaining portion of the pupil is substantially dark, the illuminated portions and dark portions being different between the first and second illumination profiles.

11. An apparatus configured to derive a correction for an optical system, the optical system being operable for both delivering illuminating radiation to a target structure and collecting radiation after interaction with the target structure, the apparatus comprising a processor system configured to at least:
    receive a first intensity profile representing radiation collected by the optical system while illuminating a pupil of the optical system in accordance with a first illumination profile;
    receive a second intensity profile representing radiation collected by the optical system while illuminating the pupil of the optical system in accordance with a second illumination profile different from the first illumination profile, each of the first and second intensity profiles representing a distribution of a plurality of radiation characteristic values on at least a first side of a middle of the respective intensity profile and a distribution of a plurality of radiation characteristic values on at least a second side of the middle of the respective intensity profile; and
    derive using at least two values from each of the at least first and second sides of a middle of the respective intensity profile of each of the first and second intensity profiles a correction for mitigating the effect of interaction of the illuminating radiation with the optical system, as opposed to interaction with a target structure.

12. The apparatus of claim 11, wherein the processor system is configured to use different portions of the first and second intensity profiles to synthesize an intensity profile representing the effect of interaction of the illuminating radiation with the optical system.

13. The apparatus of claim 11, wherein each of the first and second intensity profiles represents a distribution of radiation in a back focal plane of the optical system and wherein the processor system is configured to use portions of the first and second intensity profiles corresponding to different regions of the back focal plane.

14. The apparatus of claim 11, wherein the optical system and/or a contaminant detection system of the apparatus, comprises at least one optical element provided with a dielectric coating configured to enhance an evanescent wave interaction between the at least one optical element and a structure or surface of interest.

15. The apparatus of claim 11, wherein the processor system is configured to receive a further intensity profile representing radiation collected by the optical system while illuminating the pupil of the optical system in accordance with a further illumination profile different from the first and second illumination profiles, and configured to use the first, second and further intensity profiles to derive the correction.

16. The apparatus of claim 11, wherein the optical system includes a solid immersion lens and a mounting operable to hold the solid immersion lens within a distance from the target structure that is less than a wavelength of the illuminating radiation.

17. The apparatus of claim 11, wherein the processor system is configured to receive a third intensity profile representing radiation collected by the optical system after interaction with the optical system and a reference structure, and use the third intensity profile to derive a further correction.

18. The apparatus of claim 17, wherein the optical system includes a solid immersion lens and a mounting operable to hold the solid immersion lens within a distance from the target structure that is less than a wavelength of the illuminating radiation, and the processor system is configured to receive a fourth intensity profile representing radiation collected by the optical system after interaction with the optical system and the reference structure without the solid immersion lens present, and use both the third and fourth intensity profiles to derive the further correction.

19. The apparatus of claim 17, wherein the processor system is further configured to receive a reference intensity profile representing characteristics of the illuminating radiation prior to interaction with the optical system and target structure, and to use the reference intensity profile to derive the further correction.

20. The apparatus of claim 11, wherein in each of the first and second illumination profiles a portion of the pupil is illuminated that is less than or equal to approximately one half of the pupil, while a remaining portion of the pupil is substantially dark, the illuminated portions and dark portions being different between the first and second illumination profiles.

21. The apparatus of claim 11, wherein the first and second intensity profiles comprise radiation collected from a numerical aperture >1 region.

22. An apparatus configured to derive a correction for an optical system, the optical system being operable for both delivering illuminating radiation to a target structure and collecting radiation after interaction with the target structure, the apparatus comprising a processor system configured to at least:
receive a first intensity profile representing radiation collected by the optical system while illuminating a pupil of the optical system in accordance with a first illumination profile;
receive a second intensity profile representing radiation collected by the optical system while illuminating the pupil of the optical system in accordance with a second illumination profile different from the first illumination profile;
receive a reference intensity profile representing illuminating radiation collected by the optical system from a reference structure separate from the target structure and located or locatable at a same side of the optical system as the target structure; and
derive, using the first, second and reference intensity profiles, one or more corrections for mitigating the effect of interaction of the illuminating radiation with the optical system, as opposed to interaction with a target structure.

23. The apparatus of claim 22, wherein the processor system is configured to use different portions of the first and second intensity profiles to synthesize an intensity profile representing the effect of interaction of the illuminating radiation with the optical system.

24. The apparatus of claim 22, wherein each of the first and second intensity profiles represents a distribution of radiation in a back focal plane of the optical system and wherein the processor system is configured to use portions of the first and second intensity profiles corresponding to different regions of the back focal plane.

25. The apparatus of claim 22, wherein the first and second intensity profiles comprise radiation collected from a numerical aperture >1 region.

26. The method of claim 1, wherein the first and second intensity profiles comprise radiation collected from a numerical aperture >1 region.

\* \* \* \* \*